US011251771B2

United States Patent
Teramura

(10) Patent No.: US 11,251,771 B2
(45) Date of Patent: Feb. 15, 2022

(54) PIEZOELECTRIC DEVICE AND ELECTRONIC APPARATUS

(71) Applicant: KYOCERA Corporation, Kyoto (JP)

(72) Inventor: Tsuyoshi Teramura, Moriyama (JP)

(73) Assignee: KYOCERA CORPORATION, Kyoto (JP)

( * ) Notice: Subject to any disclaimer, the term of this patent is extended or adjusted under 35 U.S.C. 154(b) by 138 days.

(21) Appl. No.: 16/695,887

(22) Filed: Nov. 26, 2019

(65) Prior Publication Data

US 2020/0169244 A1  May 28, 2020

(30) Foreign Application Priority Data

Nov. 27, 2018 (JP) .............................. JP2018-221197
Nov. 27, 2018 (JP) .............................. JP2018-221198

(51) Int. Cl.
| | |
|---|---|
| *H03H 9/10* | (2006.01) |
| *H03H 9/02* | (2006.01) |
| *H03H 9/19* | (2006.01) |
| *H03H 9/05* | (2006.01) |

(52) U.S. Cl.
CPC ...... *H03H 9/1021* (2013.01); *H03H 9/02102* (2013.01); *H03H 9/0509* (2013.01); *H03H 9/0519* (2013.01); *H03H 9/0552* (2013.01); *H03H 9/19* (2013.01)

(58) Field of Classification Search
CPC .... H03H 9/02102; H03H 9/0509; H03H 9/19; H03H 9/1021; H03H 9/0552; H03H 9/15; H03H 3/02; H03H 3/04; H03H 2003/0407; H03B 5/04; H03B 5/32
See application file for complete search history.

(56) References Cited

U.S. PATENT DOCUMENTS

| | | | |
|---|---|---|---|
| 9,548,717 B2 * | 1/2017 | Takase | ................. H03H 9/1021 |
| 2015/0123737 A1 * | 5/2015 | Yokoo | ...................... H03B 5/32 |
| | | | 331/34 |
| 2015/0295557 A1 | 10/2015 | Takase | |
| 2016/0035962 A1 | 2/2016 | Yamashita | |
| 2016/0197594 A1 * | 7/2016 | Hanzawa | ............... H01C 7/008 |
| | | | 310/348 |

FOREIGN PATENT DOCUMENTS

| | | | |
|---|---|---|---|
| JP | 2000-049560 A | | 2/2000 |
| JP | 2006-196702 A | | 7/2006 |

(Continued)

*Primary Examiner* — Jeffrey M Shin
(74) *Attorney, Agent, or Firm* — Volpe Koenig

(57) ABSTRACT

In a crystal unit, a substrate is rectangle-shaped. A frame includes a pair of portions located in regions on the sides of a pair of short sides of the substrate on the lower surface of the substrate and forms a concave portion between these pair of portions. An electrode pad is located on the upper surface of the substrate. A connection pad is located on the lower surface of the substrate within the frame. A plurality of external terminals are located on the lower surface of the frame. A crystal element is mounted on the electrode pad. A temperature sensing element is mounted on the connection pad. A ratio S2/S1 of an area S1 of a rectangular region formed by an outer edge of the lower surface of the frame and an area S2 of a smallest rectangular region containing all of the external terminals is 0.75 to 0.91.

19 Claims, 10 Drawing Sheets

(56) References Cited

FOREIGN PATENT DOCUMENTS

| | | |
|---|---|---|
| JP | 2010-087715 A | 4/2010 |
| JP | 2013-146003 A | 7/2013 |
| JP | 2016-032243 A | 3/2016 |
| JP | 2016-072652 A | 5/2016 |
| JP | 2016-082538 A | 5/2016 |
| WO | 2014/077278 A1 | 5/2014 |

* cited by examiner

FIG.3
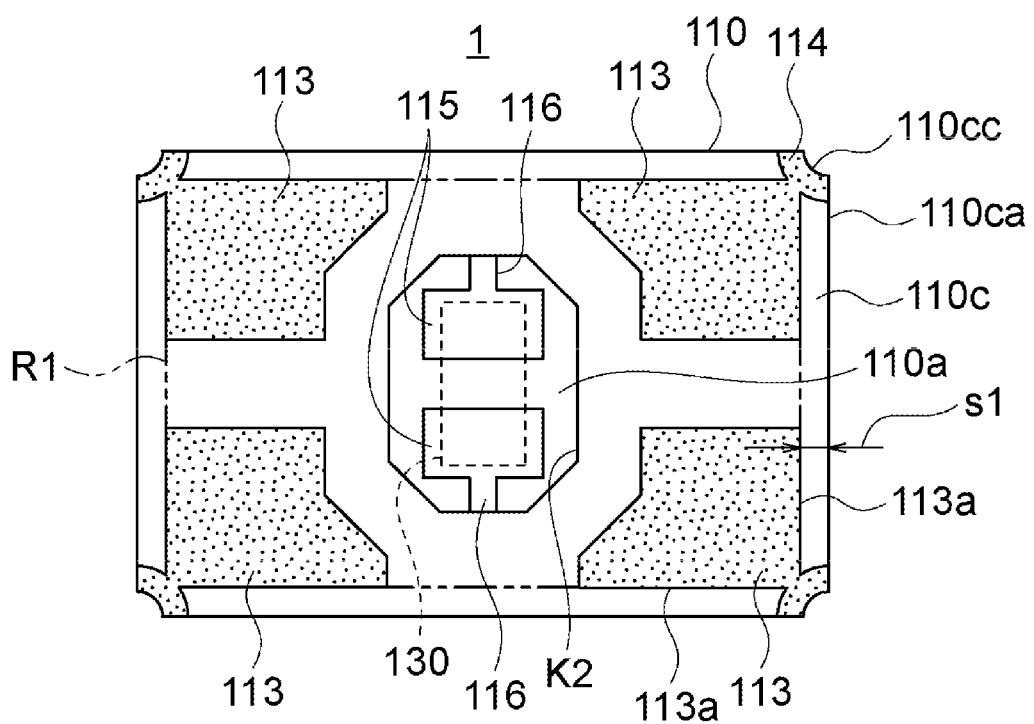
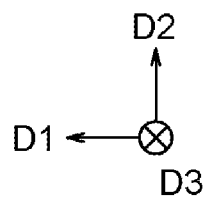

PIEZOELECTRIC DEVICE AND ELECTRONIC APPARATUS

TECHNICAL FIELD

The present disclosure relates to a piezoelectric device and an electronic apparatus including the piezoelectric device. The piezoelectric device is for example a crystal unit (also called a quartz crystal unit or quartz crystal resonator) and a crystal oscillator (also called a quartz crystal oscillator).

BACKGROUND ART

As the piezoelectric device, there is known one having a so-called H-package (for example Patent Literature 1). An H-package has a substrate, a first frame positioned on the upper surface of the substrate, and a second frame positioned on the lower surface of the substrate. In the upper surface of the substrate, a crystal vibration element (also called a crystal or quartz crystal) is mounted in a region surrounded by the first frame. A thermistor or IC (integrated circuit) is mounted in a region surrounded by the second frame in the lower surface of the substrate. The lower surface of the second frame is provided with external terminals for mounting the piezoelectric device on a circuit board etc. in an electronic apparatus.

Further, there is also known a configuration pseudo realizing an H-package by using a circuit board (for example Patent Literature 2). In this configuration, use is made of a container type package as the portion corresponding to the substrate and first frame described above. As the portion corresponding to the second frame, use is made of a circuit board having an opening formed in it. By mounting the container type package on the upper surface of the circuit board so as to cover the opening, an H-package is pseudo configured. The lower surface of the circuit board is provided with external terminals in the same way as the second frame. In Patent Literature 2, the external terminals are separated from the outer edges of the circuit board.

It is known that a crystal unit and crystal oscillator exhibit so-called hysteresis characteristics. That is, in a case where an oscillation frequency changes due to a temperature change, even with respect to the same temperature, the oscillation frequencies (from another viewpoint, difference) are different between that at the time of a temperature rise and that at the time of a temperature fall. A structure of the package for reducing such hysteresis characteristics is also proposed (for example Patent Literature 3).

CITATION LIST

Patent Literature

Patent Literature 1: Japanese Patent Publication No. 2000-49560
Patent Literature 2: Japanese Patent Publication No. 2016-082538
Patent Literature 3: Japanese Patent Publication No. 2010-087715

SUMMARY OF INVENTION

A piezoelectric device according to one aspect of the present disclosure includes a substrate, a frame, an electrode pad, a connection pad, a plurality of external terminals, a piezoelectric element, a temperature sensing component, and a lid. The substrate is rectangle-shaped. The frame includes a pair of portions located in regions at the sides of the pair of short sides of the substrate in the lower surface of the substrate and forms a concave portion between the pair of portions. The electrode pad is located on the upper surface of the substrate. The connection pad is located on the lower surface of the substrate within the frame. The plurality of external terminals are located on the lower surface of the frame. The piezoelectric element is mounted on the electrode pad. The temperature sensing component is mounted on the connection pad. The lid air-tightly seals the piezoelectric element. A ratio S2/S1 between an area S1 of a rectangular region formed by the outer edge of the lower surface of the frame and an area S2 of the smallest rectangular region containing all of the external terminals is 0.75 to 0.91.

A piezoelectric device according to one aspect of another viewpoint of the present disclosure includes a substrate, a frame, an electrode pad, a connection pad, a plurality of external terminals, a piezoelectric element, a temperature sensing component, and a lid. The substrate is rectangle-shaped. The frame includes a pair of portions located in regions at the sides of the pair of short sides of the substrate in the lower surface of the substrate and forms a concave portion between the pair of portions. The electrode pad is located on the upper surface of the substrate. The connection pad is located on the lower surface of the substrate within the frame. The plurality of external terminals are located on the lower surface of the frame. The piezoelectric element is mounted on the electrode pad. The temperature sensing component is mounted on the connection pad. The lid air-tightly seals the piezoelectric element. The thickness in the vertical direction of the substrate is 80 µm to 150 µm.

An electronic apparatus according to one aspect of the present disclosure includes any of the piezoelectric devices described above, a base body, and a plurality of external pads which are located on the surface of the base body and are bonded to the plurality of external terminals.

BRIEF DESCRIPTION OF DRAWINGS

FIG. 3 is a bottom view of the crystal unit in FIG. 1.

DESCRIPTION OF EMBODIMENTS

Figure 1:
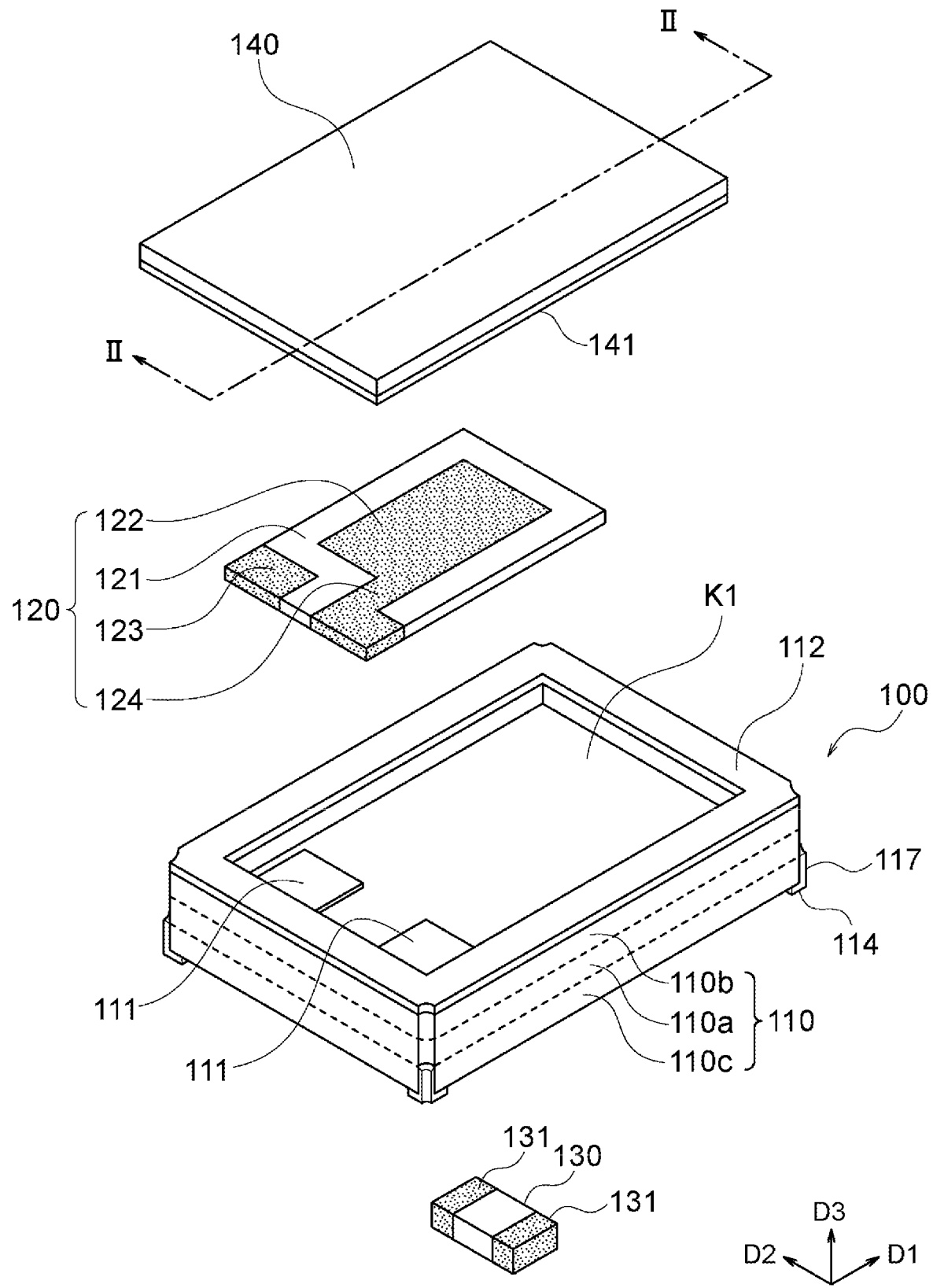
FIG. 1 is a disassembled perspective view showing the configuration of a crystal unit according to a first embodiment.

Below, embodiments according to the present disclosure will be explained with reference to the drawings. Note that, in the drawings, for convenience, sometimes an orthogonal coordinate system comprised of a D1 axis, D2 axis, and D3 axis will be attached. In the crystal units according to the embodiments, any direction may be used as the "above" or "below". Below, however, for convenience, sometimes the "upper surface" or "lower surface" and other terms will be used assuming the +D3 side to be the upper part. Further, in the following explanation, when referring to "viewed on a plane", unless particularly explained, this means "viewed in the D3 direction".

After the explanation of the first embodiment, basically only portions different from the previously explained embodiments will be explained. The items which are not particularly referred to may be considered the same as the previously explained embodiments. Further, even if there are differences with respect to configurations corresponding to each other among the plurality of embodiments, for convenience of explanation, sometimes the same notations will be attached.

First Embodiment

Figure 2:
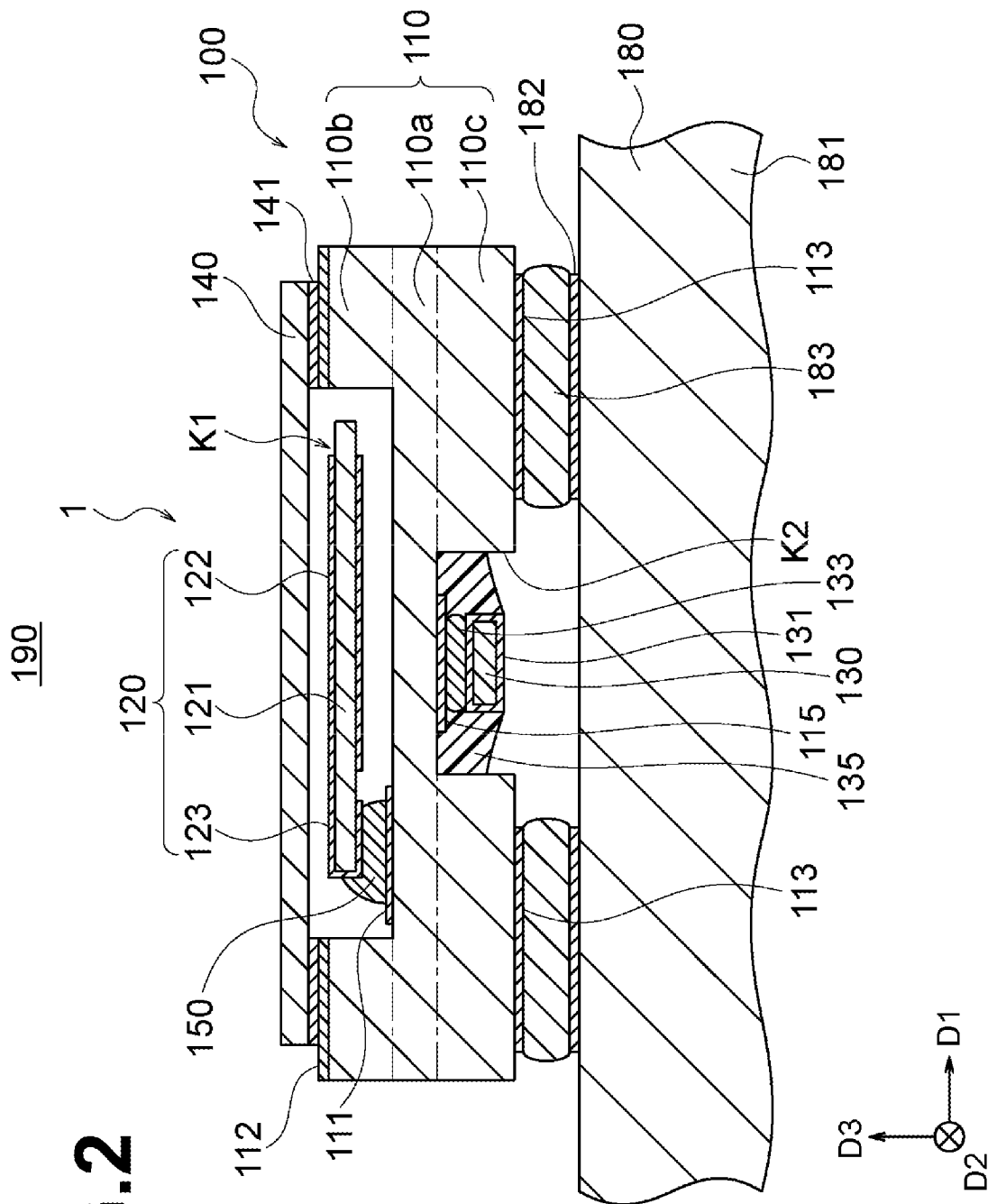
FIG. 2 is a cross-sectional view taken along the II-II line in FIG. 1.

FIG. 1 is a disassembled perspective view showing the configuration of a crystal unit 1 according to a first embodiment. FIG. 2 is a cross-sectional view taken along the II-II line in FIG. 1. FIG. 3 is a bottom view of the crystal unit 1. Note that, in FIG. 3, illustration of some of the components (resin 135) is omitted, and some of the components (temperature sensing element 130) are shown by dotted lines.

The crystal unit 1 is schematically configured as a thin rectangular cuboid shaped electronic part having sides parallel to the D1 axis, D2 axis, and D3 axis. The crystal unit 1, for example, as shown in FIG. 2, is surface-mounted on a circuit board 180 and configures an electronic apparatus 190 together with the circuit board 180. The crystal unit 1 is configured as a so-called crystal unit equipped with a temperature sensing element, generates vibration to be utilized for generation of an oscillation signal etc., and converts temperature to an electrical signal. This electrical signal is for example utilized by the electronic circuit on the circuit board 180 for compensation of a change of the frequency characteristics of the crystal unit 1 due to a temperature change.

The crystal unit 1, as particularly shown in FIG. 1, has an element mounting member 100, a crystal element 120 (quartz crystal element) mounted on the element mounting member 100 from the upper surface side, a temperature sensing element 130 mounted on the element mounting member 100 from the lower surface side, and a lid 140 sealing the crystal element 120. The element mounting member 100 and lid 140 configure the package of the crystal unit 1. The temperature sensing element 130 is covered by a resin 135 in at least part as shown in FIG. 2.

(Element Mounting Member)

The element mounting member 100 has an insulation base body 110 and various conductors which are positioned on the surface and/or inside the insulation base body 110. The various conductors are for example a pair of electrode pads 111 for mounting the crystal element 120, a pair of connection pads 115 for mounting the temperature sensing element 130, and four external terminals 113 for mounting the crystal unit 1 on the circuit board 180.

The pair of electrode pads 111 are electrically connected with two among the four external terminals 113 by interconnect conductors provided in the element mounting member 100. The pair of connection pads 115 are electrically connected with the other two of the four external terminals 113 by interconnect conductors provided in the element mounting member 100. Consequently, the crystal element 120 and the temperature sensing element 130 are electrically connected through the external terminals 113 to the circuit board 180.

The above interconnect conductors are basically omitted from the illustration. They may be suitably configured by layer-shaped conductors and/or by via conductors positioned on the surface and/or inside the element mounting member 100. In FIG. 3, two interconnect patterns 116 configuring part of the interconnect conductors connecting the two connection pads 115 and the two external terminals 113 are shown.

(Insulation Base Body)

The insulation base body 110 has a substrate part 110a, a first frame 110b positioned on the upper surface of the substrate part 110a, and a second frame 110c positioned on the lower surface of the substrate part 110a. A first concave portion K1 is formed by the upper surface of the substrate part 110a and the inner circumferential surface of the first frame 110b. A second concave portion K2 is formed by the lower surface of the substrate part 110a and the inner circumferential surface of the second frame 110c. The first concave portion K1 is air-tightly sealed by the lid 140. The insulation base body 110 forms an H-shape in cross-section. Due to this, a so-called H-package is configured.

The substrate part 110a is schematically plate shaped having a constant thickness. The planar shape thereof is rectangle-shaped. More particularly, the planar shape of the substrate part 110a is non-square rectangular and has a pair of long sides and a pair of short sides. The ratio between the long sides and the short sides may be suitably set. For example, the long sides are 1.1 times or more, 1.2 times or more, or 1.3 times or more the short sides. Further, the long sides may be 1.5 times or less, 1.4 times or less, or 1.3 times or less the short sides. The lower limits and the upper limits described before may be suitably combined unless they are contradictory.

Note that, when referring to "rectangle-shaped" or "rectangular shape" etc., the corner portions of the rectangle may be formed with concave portions (for example, castellations) shown in the figures or may be chamfered by flat surfaces or curved surfaces. The same is true for the other members as well. Further, the same is true for polygonal shapes.

The first frame 110b and the second frame 110c are substantially frame shapes having constant thicknesses. The thickness of the first frame 110b may be thinner than, equal to, or thicker than the thickness of the substrate part 110a. Further, the thickness of the second frame 110c may be thinner than, equal to, or thicker than the thickness of the substrate part 110a and/or first frame 110b. In the example shown, the thickness of the substrate part 110a becomes thinner than the thicknesses of the first frame 110b and second frame 110c.

In the first frame 110b (first concave portion K1), the shape in cross-section perpendicular to the D3 axis (planar shape) and the dimensions in cross-section are substantially the same between the substrate part 110a side (−D3 side) and the opposite side to this (+D3 side). In the same way, in the second frame 110c (second concave portion K2), the shape in cross-section perpendicular to the D3 axis (planar shape) and the dimensions in cross-section are substantially the same between the substrate part 110a side (+D3 side) and the opposite side to this (−D3 side). However, unlike the example shown, in each of the first frame 110b and second frame 110c, the planar shapes and the dimensions may be different between the substrate part 110a side and its opposite side as well. Note that, in this case, the explanation for the planar shapes and the dimensions of the first frame 110b and the second frame 110c in the present disclosure may be applied to both of the substrate part 110a side and its opposite side or may be applied to either side.

When viewed on a plane, the inner edge and outer edge of the first frame 110b are made rectangular shapes having four sides parallel to the four sides of the substrate part 110a. From another viewpoint, the first frame 110b has a pair of long sides and a pair of short sides. The outer edge of the first frame 110b substantially matches with the outer edge of the substrate part 110a (overlay it). The width from the inner edge to the outer edge in the first frame 110a (widths of different sides) is for example constant at each of the sides of the first frame 110b. The widths of the four sides may be the same as each other or may be different from each other.

The first concave portion K1 is for example configured relatively broad when viewed on a plane. As one example, the area of the first concave portion K1 is ½ or more or ⅔ or more of the area of the substrate part 110a. Further, from another viewpoint, the widths of the sides of the first frame 110b are for example ¼ or less, ⅕ or less, ⅙ or less, or ⅐ or less of the lengths of the long sides and/or short sides of the substrate part 110a.

When viewed on a plane, the center of the figure (center) of the first concave portion K1 substantially matches with the center of the figure of the substrate part 110a. When describing this for confirmation, the center of the figure (also called the centroid or geometric center) is the point where, in a plane shape, a cross-sectional primary moment with respect to an axis passing through that point becomes 0. The distance between the center of the figure of the substrate part 110a and the center of the figure of the first concave portion K1 is for example ⅕ or less or 1/10 or less of the lengths of the long sides of the substrate part 110a.

When viewed on a plane, the outer edge of the second frame 110c is made a rectangular shape having four sides parallel to the four sides of the substrate part 110a. In more detail, the outer edge of the second frame 110c substantially matches with the outer edge of the substrate part 110a (overlay it). Note that, from this, in the explanation which will be given later, the relative position and size of the external terminals 113 or second concave portion K2 relative to the outer edge of the substrate part 110a or a region formed by the outer edge and the relative position and size of the external terminals 113 or second concave portion K2 relative to the outer edge of the second frame 110c or a region formed by the outer edge will not be differentiated. Further, sometimes only one will be referred to.

When viewed on a plane, the shape of inner edge of the second frame 110c (second concave portion K2) may be made a suitable shape such as a rectangular, circular, elliptical shape, or a polygonal shape other than a rectangular shape. In the example shown, the shape of the second concave portion K2 is made a rectangular shape having short sides parallel to the long sides of the substrate part 110a and long sides parallel to the short sides of the substrate part 110a wherein the corner portions are relatively largely chamfered. From another viewpoint, the shape of the second concave portion K2 is made a shape where the long direction of the substrate part 110a is made the short direction and where the short direction of the substrate part 110a is made the long direction.

When viewed on a plane, the second concave portion K2 is for example made narrower in its area than the area of the first concave portion K1. As one example, the area of the second concave portion K2 is ⅘ or less or ¾ or less relative to the area of the substrate part 110a and/or first concave portion K1. Further, from another viewpoint, the widths of the short sides of the second frame 110c are for example ¼ or more or ⅓ or more of the lengths of the long sides of the substrate part 110a.

When viewed on a plane, the second concave portion K2 is for example positioned at the center side of the substrate part 110a. In more detail, the center of the figure of the substrate part 110a is positioned within the second concave portion K2. Further, the distance between the center of the figure of the substrate part 110a and the center of the figure of the second concave portion K2 is for example ¼ or less or 1/10 or less of the lengths of the long sides of the substrate part 110a.

The substrate part 110a, first frame 110b, and second frame 110c are for example configured by alumina ceramic or glass ceramic or another ceramic material. The substrate part 110a, first frame 110b, and second frame 110c may be configured by the same materials or may be configured by materials which are different from each other. From the viewpoint of materials and/or the manufacturing method etc., each of the substrate part 110a, first frame 110b, and second frame 110c may be one using single insulation layer or may be one formed by stacking a plurality of insulation layers.

The substrate part 110a and the first frame 110b are for example integrally formed. Further, the substrate part 110a and the second frame 110c are for example integrally formed. The term "integrally formed" may mean for example that the insulation material configuring the substrate part 110a and the insulation material configuring the first frame 110b (or second frame 110c) directly contact and are bonded with each other. Accordingly, "integrally formed" need not require that both materials be the same. For example, the substrate part 110a and the first frame 110b (and/or second frame 110c) may be integrally formed by stacking and firing ceramic green sheets having compositions which are different from each other.

In the figure, borders between the substrate part 110a and the first frame 110b and second frame 110c are clearly shown. However, from the viewpoint of materials etc., it may also be impossible to specify these borders. For example, the substrate part 110a, first frame 110b, and second frame 110c may be specified by the first concave portion K1, second concave portion K2, and/or the presence of conductor layers interposed between these parts.

(Electrode Pads)

The pair of electrode pads 111 are configured by a conductor layer positioned on the upper surface of the substrate part 110a. The material and thickness of the conductor layer may be suitably set. The pair of electrode pads 111 are for example arranged in a direction along one short side of the substrate part 110a. Further, they are adjacent to the inner circumferential surface of the first frame 110b. The term "adjacent" referred to here may mean for example that the distance from the inner circumferential surface of the first frame 110b (D1 direction) is smaller than the diameters in the D1 direction of the electrode pads 111 (for example the maximum diameters when the electrode pads 111 are not rectangular). The electrode pads 111 may contact the first frame 110b or may be separated from it. The planar shapes of the electrode pads 111 may be suitable ones. For example, they may be rectangle-shaped.

As explained above, in the present embodiment, when viewed on a plane, the second concave portion K2 is made smaller than the first concave portion K1. From another viewpoint, in the upper surface of the substrate part 110a, the region surrounded by the first frame 110*b* has a region which does not overlap the second concave portion K2. Further, the pair of electrode pads 111, for example, as shown in FIG. 2, are positioned in their entireties in the region in the substrate part 110*a* which does not overlap the second concave portion K2. Naturally, unlike the example shown, the pair of electrode pads 111 may partially overlap the second concave portion K2 as well.

(Connection Pads)

The connection pads 115 are configured by a conductor layer which is positioned on the lower surface of the substrate part 110*a*. The material and thickness of the conductor layer may be suitably set. The pair of connection pads 115 are for example arranged at the center side of the substrate part 110*a* and arranged in a direction in which the long sides of the substrate part 110*a* face each other (D2 direction, from another viewpoint, the long direction of the second concave portion K2). The planar shapes of the connection pads 115 may be suitable ones. For example, they may be rectangle-shaped.

(External Terminals)

The external terminals 113 are configured by a conductor layer positioned on the lower surface of the second frame 110*c*. The material and thickness of the conductor layer may be suitably set. Four external terminals 113 are for example positioned at the four corner sides in the lower surface of the second frame 110*c*. The planar shapes of the external terminals 113 may be suitable ones. In the example in FIG. 3, the external terminals 113 are shaped as a rectangular having four sides parallel to the four sides of the outer edge of the second frame 110*c* from which part of the second concave portion K2 side is removed. The edge part of this removed part may be linear, may be a combination of two or more straight lines (example shown), or may be a curve.

At the lower surface of the second frame 110*c*, the conductor layer configuring the external terminals 113 may have portions other than the external terminals 113 as well. In the example in FIG. 3, this conductor layer has connection portions 114 which are positioned between the external terminals 113 and concave portion 110*cc* (castellation) at the corner portions of the second frame 110*c*. The connection portions 114 are connected to a castellation conductor 117 (FIG. 1) formed as a film in the concave portion 110*cc*. Note that, the connection portions 114 and castellation conductor 117 need not be provided.

As described above, when the conductor layer positioned on the lower surface of the second frame 110*c* configures portions other than the external terminals 113 as well, the external terminals 113 and the portions other than the external terminals 113 may be reasonably differentiated from their shapes and/or functions. For example, in the planar shape of the conductor layer, distinctively projecting portions may be grasped as portions other than the external terminals 113. In the example in FIG. 3, sides 113*a* of the external terminals 113 which face sides 110*ca* of the outer edge of the second frame 110*c* can be recognized. The connection portions 114 project from parts of the sides 113*a* (for example, by ¼ or less of the length of one side 113*a*). The external terminals 113 and the connection portions 114 are differentiated from this.

The four external terminals 113 are separated from the outer edge (long sides and short sides) of the lower surface of the second frame 110*c*. Specifically, for example, in the example in FIG. 3, each external terminal 113 includes at its outer edge two sides 113*a* which face the two sides 110*ca* forming one corner portion on the side where this is positioned (one long side and one short side which this adjoins) among the four sides 110*ca* in the outer edge of the second frame 110*c*. From another viewpoint, the sides 113*a* extend along (for example parallel to) the sides 110*ca* of the outer edge of the second frame 110*c*. The sides 113*a* and the sides 110*ca* which face each other are spaced apart by distances s1. The distances s1 may be the same as each other between the two sides 113*a* of one external terminal 113 (example shown) or may be different from each other. Further, the distances s1 may be the same as each other among the four external terminals 113 (example shown) or may be different from each other.

Further, from another viewpoint, when considering the smallest rectangular region R1 containing the external terminals 113, the area S2 of the rectangular region R1 is smaller than the area S1 of the rectangular region (the concave portion 110*cc* or chamfering of corner portions may be ignored) which is configured by the outer edge of the second frame 110*c* (from another viewpoint, the substrate part 110*a*). In the example shown, the rectangular region R1 becomes one where its four sides are superposed on the two sides 113*a* of each of the four external terminals 113 (eight sides 113*a* in total).

In the plurality of external terminals 113, the relative relationships between the positions and the roles may be suitably set. For example, among the four external terminals 113, the two positioned at a pair of diagonally opposite corners of the lower surface of the second frame 110*c* are electrically connected with the pair of electrode pads 111. The other two external terminals 113 which are positioned at the other pair of diagonally opposite corners are electrically connected with the pair of connection pads 115.

(Lid)

The lid 140 is for example made of an alloy containing at least one of iron, nickel, or cobalt. The outer circumferential portion of the lid 140 is bonded to the upper surface of the first frame 110*b* over its entire circumference. Due to this, the first concave portion K1 is sealed. The first concave portion K1 may be sealed with gas inside it or may be rendered a vacuum state. The gas is for example nitrogen. "Vacuum" is in actuality a state where the pressure is reduced more than the atmospheric pressure.

The lid 140 and the first frame 110*b* may be bonded by a suitable method. For example, the two are bonded by a sealing-use conductor pattern 112 provided on the upper surface of the first frame 110*b* and a sealing member 141 provided on the lower surface of the lid 140 being bonded by seam welding.

(Crystal Element)

The crystal element 120 has for example a crystal blank 121 (quartz crystal blank), a pair of excitation electrodes 122 for applying a voltage to the crystal blank 121, and a pair of connection-use electrodes 123 for mounting the crystal element 120 on the pair of electrode pads 111. The pair of excitation electrodes 122 and the pair of connection-use electrodes 123 are connected by a pair of lead-out electrodes 124.

The crystal blank 121 is for example substantially formed in a flat-plate shape having a rectangular planar shape. From another viewpoint, the crystal blank 121 is given a shape having a long direction and short direction. The crystal blank 121 is for example formed by an AT-cut crystal blank. Note that, although not particularly shown, the crystal blank 121 may be known various ones other than the example shown. For example, the crystal element may be a so-called tuning-fork type one as well. Further, the crystal blank 121, in a case where it is plate shaped, may be a so-called mesa type having a thicker center portion or may be a so-called convex type so as to be thinner toward the outer edge. Further, the planar shape (shape of the outer edge) of the plate-shaped crystal blank may be an ellipse or other shape other than a rectangular.

The excitation electrodes 122, connection-use electrodes 123, and lead-out electrodes 124 are configured by conductor layers superimposed on the surfaces of the crystal blank 121. The materials and thicknesses of the conductor layers may be suitably set. Two excitation electrodes 122 are positioned at the center side of the pair of major surfaces (front and back of the plate shape) of the crystal blank 121 and face each other while sandwiching the crystal blank 121 therebetween. On at least one major surface (the two major surfaces in the example shown) of the crystal blank 121, the pair of connection-use electrodes 123, for example, are positioned on one side of the long direction (on the side of one short side) of the crystal blank 121 relative to the pair of excitation electrodes 122. Further, for example, the connection-use electrodes 123 are arranged along one short side of the crystal blank 121. The pair of lead-out electrodes 124 connect the pair of excitation electrodes 122 and the pair of connection-use electrodes 123 by the shortest route. The specific shapes of the excitation electrode 122, connection-use electrode 123, and lead-out electrode 124 may be suitably set. For example, each is rectangular in the example shown.

(Mounting of Crystal Element)

The crystal element 120, as shown in FIG. 2, is mounted on the element mounting member 100 by bonding of the connection-use electrodes 123 and the electrode pads 111 by a conductive adhesive 150. As described above, the pair of connection-use electrodes 123 are positioned on one side of the long direction of the crystal element 120, therefore the crystal element 120 is supported on one end side like a cantilever while the other end is formed as a free end. The conductive adhesive 150 is formed by a resin obtained by mixing a conductive filler therein. The resin is for example a thermosetting resin. The specific materials of the resin and the conductive filler and the diameter of the conductive filler etc. may be suitably set.

(Temperature Sensing Element)

The temperature sensing element 130 is, for example, configured by an element changing in electrical characteristics (for example resistance value) in accordance with a change of temperature. As such an element, for example, there can be mentioned a thermistor, resistance temperature detector, and diode. The temperature sensing element 130 is for example formed in substantially a rectangular cuboid shape and has a pair of connection-use terminals 131 at its two ends. The connection terminals 131 are exposed at least at the surface facing the lower surface of the substrate part 110a in the rectangular cuboid shape of the temperature sensing element 130. In the example shown, the connection terminals 131 are formed over five surfaces of the upper and lower surfaces, side surfaces, and the end surface at each end part of the long direction of the rectangular cuboid.

The pair of connection terminals 131 face the pair of connection pads 115 and are bonded to the latter by a bonding material 133 which is interposed between the two. The bonding material 133 is configured by solder or a conductive adhesive.

(Resin)

The resin 135 is for example formed by a thermosetting resin (for example an epoxy resin). The resin 135 may contain a filler as well. As the filler, for example, there can be mentioned one having a lower thermal expansion coefficient compared with the resin (for example $SiO_2$). Other than this, for example, a filler having a lower or higher thermal conductivity compared with the resin may be added for adjustment of the thermal conductivity as well.

The resin 135 may function as for example a so-called underfill. Specifically, the resin 135 is filled between the lower surface of the substrate part 110a and the temperature sensing element 130 and may be adhered to them. Further, the resin 135 may be filled in the second concave portion K2 up to a suitable position in position up to the opening surface thereof (lower surface of the second frame 110c).

Specifically, for example, the surface of the resin 135 on the side (−D3 side) opposite to the substrate part 110a may be positioned in the upper part (+D3 side) from the surface on the −D3 side of the temperature sensing element 130, may be positioned on the surface on the −D3 side of the temperature sensing element 130 (example shown), or may be positioned at the lower part from the surface on the −D3 side of the temperature sensing element 130. In other words, the resin 135 may be adhered to a part on the +D3 side in the side surface of the temperature sensing element 130 (at least one side surface, for example, all (four) side surfaces, same is true for the following explanation), may be adhered to all of the side surfaces of the temperature sensing element 130 (example shown), or may be adhered to the surface on the −D3 side of the temperature sensing element 130 in addition to the side surfaces of the temperature sensing element 130 (may cover the entirety of the temperature sensing element 130).

Further, for example, in the surfaces configuring the second concave portion K2, the resin 135 may be adhered to only a part of the lower surface of the substrate part 110a, may be adhered to only part of the substrate part 110a side of the inner circumferential surface of the second frame 110c (at least one surface, for example, all (six) surfaces, same is true below) in addition to the entirety of the lower surface of the substrate part 110a (example shown), or may be adhered to the lower surface of the substrate part 110a and the entire upper and lower parts of the inner circumferential surface of the second frame 110c.

(Circuit Board)

The circuit board 180 shown in FIG. 2 is for example configured by a known rigid substrate or flexible substrate and has an insulation substrate 181 and external pads 182 positioned on the upper surface of the insulation substrate 181. The external terminals 113 in the crystal unit 1 are bonded to the external pads 182 by solder or another bonding material 183. The bonding material 183 may be bonded over the entireties or majorities (for example 80% or more area) of the lower surfaces of the external terminals 113 and/or the upper surfaces of the external pads 182 or may be bonded to parts which cannot be said to be the majorities.

The electronic apparatus 190, for example, although not particularly shown, has an oscillation circuit and a temperature compensation circuit configured by the circuit board 180 and/or IC mounted on the circuit board 180. The oscillation circuit applies an AC voltage to the crystal element 120 through two among the four external terminals 113 to generate an oscillation signal having a predetermined frequency. The temperature compensation circuit compensates for the change of the frequency characteristics of the crystal unit 1 due to a temperature change. At this time, the temperature compensation circuit determines the amount of compensation based on a detection signal (detection temperature) from the temperature sensing element 130 obtained through two among the four external terminals 113.

The electronic apparatus 190 may be any type of apparatus utilizing an oscillation signal. For example, the electronic apparatus 190 may be a mobile terminal, personal computer (PC), GPS (global positioning system) device, or ECU (engine control unit).

(One Example of Dimensions)

Below, an example of dimensions of the parts in the crystal unit 1 will be given.

The lengths of the long sides of the substrate part 110a may be made for example 1.5 mm or more, 2.0 mm or more, or 3.0 mm or more. Further, they may be made 4.0 mm or less, 3.0 mm or less, or 2.0 mm or less. The lower limits and the upper limits described above may be suitably combined unless they are contradictory. Further, the lengths of the short sides of the substrate part 110a may be made for example 1.0 mm or more, 1.5 mm or more, or 2.0 mm or more conditional on their being shorter than the lengths of the long sides of the substrate part 110a. Further, they may be made 3.0 mm or less, 2.0 mm or less, or 1.5 mm or less. The lower limits and the upper limits described above may be suitably combined unless they are contradictory. Note that, in this illustration, the value at the second decimal places are rounded off. For example, 1.5 mm or more includes 1.46 mm, and 4.0 mm or less includes 4.04 mm.

The thickness of the substrate part 110a may be for example made 50 μm or more or 80 μm or more. Further, it may be made 170 μm or less or 150 μm or less. The lower limits and the upper limits described above may be suitably combined. Note that, in this illustration, the values at the first decimal places are rounded off. Further, the values obtained by dividing the thickness of the substrate part 110a by the lengths of the long sides of the substrate part 110a may be made for example 0.031 or more or 0.050 or more. Further, they may be made 0.106 or less or 0.094 or less. The lower limits and the upper limits described above may be suitably combined. Note that, in this illustration, the values at the fourth decimal places are rounded off.

The distances s1 of the external terminals 113 from the outer edge of the lower surface of the second frame 110c may be for example made 10 μm or more or 30 μm or more. Further, they may be made 100 μm or less or 90 μm or less. The lower limits and the upper limits described above may be suitably combined. Note that, in this illustration, the values at the first decimal places are rounded off. Further, the values obtained by dividing the distances s1 by the lengths of the long sides of the substrate part 110a may be made for example 0.013 or more or 0.038 or more. Further, they may be made 0.125 or less or 0.113 or less. The lower limits and the upper limits described above may be suitably combined. Note that, in this illustration, the values at the fourth decimal places are rounded off.

The value obtained by dividing the area S2 of the smallest rectangular surrounding the four external terminals 113 by the area S1 of the substrate part 110a may be made 0.73 or more or 0.75 or more. Further, it may be made 0.97 or less or 0.91 or less. The lower limits and the upper limits described above may be suitably combined. Note that, in this illustration, the values at the third decimal places are rounded off.

(Method for Manufacturing Crystal Unit)

As the method for manufacturing the crystal unit 1, various known manufacturing methods may be utilized. For example, the element mounting member 100 may be prepared in the following way.

First, a plurality of ceramic green sheets forming the substrate part 110a, first frame 110b, and second frame 110c are prepared. In the ceramic green sheets forming the first frame 110b and second frame 110c, openings which become the first concave portion K1 and second concave portion K2 are formed. Further, before or after the formation of these openings, a conductive paste forming various conductors (external terminals 113, electrode pads 111, connection pads 115, etc.) is arranged on the plurality of ceramic green sheets. After that, the plurality of ceramic green sheets are superposed to configure a stack, and the stack is fired.

Further, also a method of preparation of the element mounting member 100 different from the above method can be mentioned as well. First, a plurality of ceramic green sheets forming the substrate part 110a, first frame 110b, and second frame 110c are prepared. On these plurality of ceramic green sheets, a conductive paste forming various conductors (external terminals 113, electrode pads 111, connection pads 115, etc.) is arranged. Next, the plurality of ceramic green sheets are superposed to obtain a stack. Next, in the stack, the first concave portion K1 and second concave portion K2 are formed by press working. After that, the stack is fired.

As described above, in the present embodiment, the crystal unit 1 has the substrate (substrate part 110a), frame (second frame 110c), electrode pad 111, connection pad 115, a plurality of external terminals 113, piezoelectric element (crystal element 120), temperature sensing component (temperature sensing element 130), and lid 140. The substrate part 110a is rectangle-shaped. The second frame 110c includes a pair of portions (short side portions) positioned in the regions on the sides of the pair of short sides of the substrate part 110a in the lower surface of the substrate part 110a and forms the concave portion (second concave portion K2) between these pair of portions. The electrode pad 111 is positioned on the upper surface of the substrate part 110a. The connection pad 115 is positioned on the lower surface of the substrate part 110a within the second frame 110c. The plurality of external terminals 113 are positioned on the lower surface of the second frame 110c. The crystal element 120 is mounted on the electrode pad 111. The temperature sensing element 130 is mounted on the connection pad 115. The lid 140 air-tightly seals the crystal element 120. The ratio S2/S1 between the area S1 of the rectangular region formed by the outer edge of the lower surface of the second frame 110c and the area S2 of the smallest rectangular region R1 containing all external terminals 113 is 0.75 to 0.91 (the values at the third decimal places are rounded off).

Accordingly, for example, fluctuation of the characteristics of the crystal unit 1 can be reduced. Specifically, this is as follows.

The crystal unit 1 differs in the characteristics between that before mounting on the circuit board 180 and that after mounting on the circuit board 180. As such characteristics, for example, there can be mentioned a hysteresis characteristic. The hysteresis characteristic is a characteristic where, as already explained, the difference of frequencies caused by the temperature change differs between that at the time of a temperature rise and that at the time of a temperature fall even with respect to the same temperature.

Here, force generated due to the difference of thermal expansion between the element mounting member 100 in the crystal unit 1 and the circuit board 180 is transferred from the circuit board 180 to the element mounting member 100 through the external terminals 113 (and bonding material 183). This force for example acts upon the insulation base body 110 as bending stress acting to cause warping (bending deformation) at the insulation base body 110. This bending stress is transferred through each of the electrode pads 111 and/or the pair of electrode pads 111 to the crystal element 120. The bending stress transferred to the crystal element 120 can be mentioned as one of factors behind the difference of hysteresis characteristics between that before mounting on the circuit board 180 and that after mounting on the circuit board 180.

On the other hand, in the present embodiment, the smallest rectangular region R1 containing the plurality of external terminals 113 is smaller than the rectangular region configured by the outer edge of the second frame 110c (region ignoring the concave portion 110cc or chamfering of the corner portions). From another viewpoint, the plurality of external terminals 113 are separated from the outer edge of the second frame 110c. Accordingly, compared with a case where the plurality of external terminals 113 contact the outer edge of the second frame 110c, the positions at which the force from the circuit board 180 acts with respect to the plurality of external terminals 113 can be made closer to each other. As a result, the force which is added from the circuit board 180 through the plurality of external terminals 113 to the element mounting member 100 becomes harder to act as the bending stress causing the substrate part 110a to warp. Consequently, the bending stress transferred to the crystal element 120 is reduced. As a result, the difference in the hysteresis characteristics of the crystal unit 1 between that before mounting and that after mounting is reduced.

For the crystal unit 1, conventionally, various proposals have been made for the shape and dimensions etc. so as to reduce the hysteresis characteristic in the state before mounting. Accordingly, by reducing the difference of the hysteresis characteristics between that before mounting and that after mounting, it becomes possible to make the hysteresis characteristic small after mounting. From another viewpoint, it is possible to make use of various proposals for reducing the hysteresis characteristic in the state before mounting. By making the hysteresis characteristic small, for example, the accuracy of temperature compensation is improved.

Further, as described above, when the area ratio S2/S1 is controlled to 0.91 or less, for example, a significant difference is recognized in the difference of hysteresis characteristics between that before mounting and that after mounting relative to the case when the area ratio S2/S1 is 1. That is, the effect explained above can be confirmed. Further, in a case where the area ratio S2/S1 is controlled to 0.75 or more, the external terminals 113 can be expanded outwardly while making the external terminals 113 separated from the outer edge of the second frame 110c, therefore it is easy to secure the area for the external terminals 113. From another viewpoint, the probability of short-circuiting of the two or more external terminals 113 with each other at the time when a certain extent of area is secured for the external terminals 113 is reduced.

Further, in the present embodiment, in place of or in addition to a configuration where the ratio S2/S1 is 0.75 to 0.91, the thickness in the vertical direction of the substrate part 110a is made 80 µm to 150 µm.

As described above, the force caused by the difference of thermal expansion coefficients between the element mounting member 100 and the circuit board 180 acts as bending stress acting to cause the insulation base body 110 to warp and is transferred to the crystal element 120. However, in the present embodiment, the thickness of the substrate part 110a is 80 µm or more. Therefore, compared with a case where the substrate part 110a is thinner than this, the warping of the substrate part 110a is reduced. From another viewpoint, the bending stress is dispersed in the thickness direction of the substrate part 110a. Accordingly, for example, the bending stress transferred to the crystal element 120 is reduced. As a result, for example, the difference in the hysteresis characteristics of the crystal element 1 between that before mounting and that after mounting is reduced. Further, the thickness of the substrate part 110a is 150 µm or less. Therefore, for example, compared with a case where the substrate part 110a is thicker than this, the probability of separation of the temperatures between the crystal element 120 and the temperature sensing element 130 which are separated by the substrate part 110a is reduced. As a result, the accuracy of temperature compensation is improved.

Further, in the present embodiment, the value (normalized thickness) obtained by dividing the thickness in the up-down direction of the substrate part 110a by the lengths of the long sides of the substrate part 110a is 0.050 to 0.094 (the value at the fourth decimal place is rounded off).

In this case, for example, the normalized thickness is 0.050 or more, therefore it is easy to reduce warping of the substrate part 110a. Further, since the normalized thickness is 0.094 or less, it is easy to reduce the difference of temperatures of the crystal element 120 and the temperature sensing element 130.

Further, in the present embodiment, the substrate part 110a and the second frame 110c are directly bonded. That is, the two are integrally formed.

In this case, for example, stress is easily transferred from the second frame 110c to the substrate part 110a. Accordingly, for example, the effect of reduction of the bending stress just under the electrode pads 111 by making the area S2 smaller than the area S1 easily appears and/or, for example, the effect of reduction of the bending stress just under the electrode pads 111 by making the substrate part 110a relatively thick easily appears.

Further, in the present embodiment, when viewed on a plane, the electrode pads 111 are positioned in their entirety outside of the concave portion (second concave portion K2).

In this case, for example, just under the electrode pads 111, not only the thickness of the substrate part 110a, but also the thickness of the second frame 110c are secured. Accordingly, compared with the case where the electrode pads 111 overlap the second concave portion K2, warping of the insulation base body 110 just under the electrode pads 111 is reduced. From another viewpoint, just under the electrode pads 111, the bending stress is dispersed in the thickness direction of the insulation base body 110. Consequently, the bending stress which is transferred through the electrode pads 111 to the crystal element 120 is reduced. As a result, the effect of reducing the difference of the hysteresis characteristics between that before mounting and that after mounting is improved. Further, for example, the width of the second frame 110c is made broader as it overlaps the entireties of the electrode pads 111 more. Therefore, it is easy to secure the area for the external terminals 113 which are positioned on the lower surface of the second frame 110c. As a result, reduction of the area S2 is facilitated.

Further, in the present embodiment, the second concave portion K2 and the temperature sensing element 130 are shaped so that the direction (D2 direction) in which the pair of long sides of the substrate part 110a face each other is each of their long directions.

In this case, for example, just under the electrode pads 111, the thickness of the insulation base body 110 is easily secured. As a result, the bending stress which is transferred to the electrode pads 111 can be reduced. Further, for example, in a case of trying to secure the area of the external terminals 113 to a certain extent while making the area S2 smaller, the area of the external terminals 113 is secured near the second concave portion K2. At this time, as will be understood from a comparison with the second embodiment which will be explained later (FIG. 5), when the second concave portion K2 defines the short direction of the substrate part 110a as its long direction, it is easy to secure the area of the external terminals 113 on the center side of the long direction of the substrate part 110a. As a result, the force which is transferred from the circuit board 180 through the plurality of external terminals 113 to the substrate part 110a acts upon the center side in the long direction of the substrate part 110a, therefore the moment causing warping in the substrate part 110a in the long direction of the substrate part 110a becomes small. It is the long direction that easily causes warping in the substrate part 110a. Therefore, by reduction of the moment causing warping in the long direction, warping is effectively reduced in the entire substrate part 110a. Further, for example, the force according to the difference of thermal expansion between the temperature sensing element 130 and the substrate part 110a easily becomes larger in the long direction of the temperature sensing element 130. Accordingly, by the long direction of the temperature sensing element 130 and the long direction of the substrate part 110a easily causing warping in the substrate part 110a being made different, the probability of increase of warping of the substrate part 110a according to the difference of thermal expansion between the temperature sensing element 130 and the substrate part 110a is reduced.

Further, in the present embodiment, the crystal unit 1 is further provided with the insulating resin 135 adhered to the lower surfaces of the temperature sensing element 130 and substrate part 110a.

The position at which the force from the circuit board 180 acts upon the second frame 110c becomes closer to the second concave portion K2 by reduction of the area S2. As a result, for example, the stress caused by the force acting from the external terminals 113 upon the second frame 110c becomes easier to be dispersed in the resin 135 positioned in the second concave portion K2. Further, from another viewpoint, for example, the substrate part 110a is reinforced against warping by the resin 135. Accordingly, due to the provision of the resin 135, the effect of reducing the difference of the hysteresis characteristics between that before mounting and that after mounting is improved. The resin 135, unlike the substrate part 110a, is positioned not only between the temperature sensing element 130 and the crystal element 120, but also on the side surfaces etc. of the temperature sensing element 130. Therefore, compared with the case where the substrate part 110a is made thick, the probability of separation of the temperature differences between the temperature sensing element 130 and the crystal element 120 is reduced.

Further, in the present embodiment, the electronic apparatus 190 has a crystal unit 1 as described above, a base body (insulation substrate 181), and a plurality of external pads 182 which are positioned on the surface of the insulation substrate 181 and are bonded to the plurality of external terminals 113.

In such electronic apparatus 190, the hysteresis characteristic after mounting of the crystal unit 1 is reduced, therefore an oscillation signal reduced in fluctuation of frequency due to a temperature change is obtained. As a result, for example, the operation of the electronic apparatus 190 becomes stabler, the accuracy of operation is improved, and the probability of erroneous operation is reduced.

[Modification]

Figure 4:
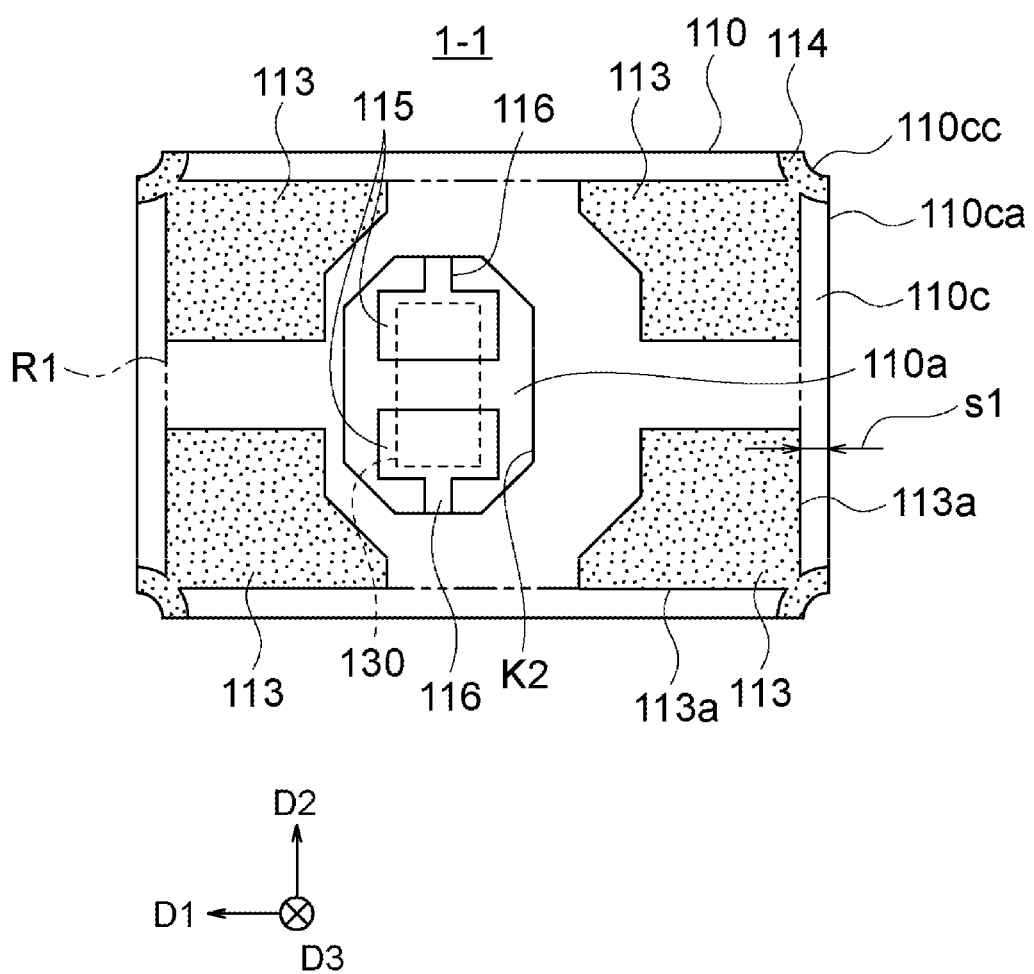
FIG. 4 is a bottom view of a crystal unit according to a modification.

FIG. 4 is a bottom view of a crystal unit 1-1 according to a modification and corresponds to FIG. 3.

As shown in this view, the center of the figure of the second concave portion K2 may be positioned on the opposite side (+D1 side) to the electrode pads 111 relative to the center of the figure of the substrate part 110a. The distance of separation in the D1 direction of the centers of figures in this case may be suitably set. For example, this distance of separation may be controlled to 1/30 or more or 1/20 or more of the lengths of the long sides of the substrate part 110a. Further, the distance of separation may be shorter than, equal to, or longer than the distance s1 of the external terminal 113 from the outer edge of the second frame 110c. For example, it may be made ½ or more or 1 time or more of the distance s1.

If in this way the center of the figure of the second concave portion K2 is positioned on the opposite side to the electrode pads 111 relative to the center of the figure of the substrate part 110a, for example, overlap of the electrode pads 111 and the second concave portion K2 can be reduced or overlap can be eliminated. As a result, for example, the thickness of the insulation base body 110 is secured just under the electrode pads 111, and bending deformation of the insulation base body 110 just under the electrode pads 111 can be reduced. Consequently, the difference of the hysteresis characteristics between that before mounting and that after mounting due to this bending deformation can be reduced.

Second Embodiment

Figure 5:
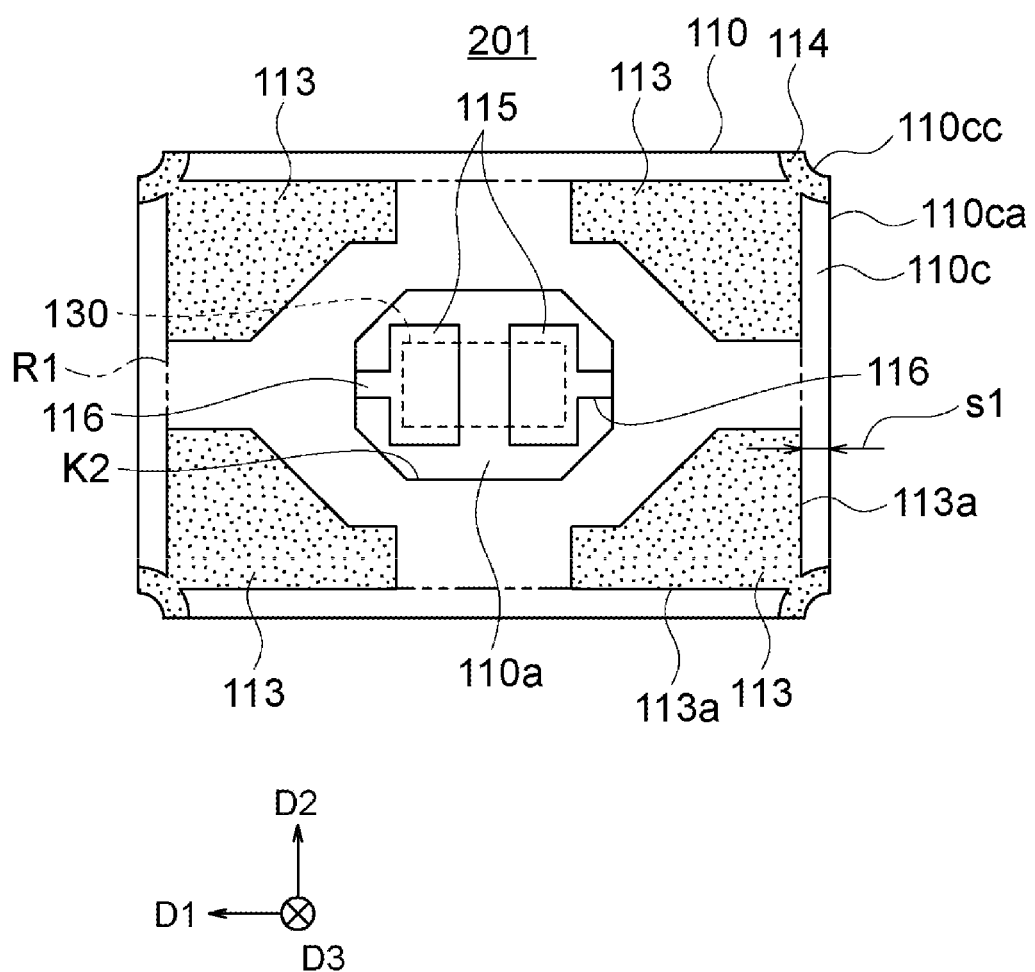
FIG. 5 is a bottom view of a crystal unit according to a second embodiment.

FIG. 5 is a bottom view of a crystal unit 201 according to a second embodiment and corresponds to FIG. 3.

In the crystal unit 201, the second concave portion K2 is shaped so that the long direction of the substrate part 110a is its long direction. The pair of connection pads 115 are arranged in the long direction of the substrate part 110a. The temperature sensing element 130 has the long direction of the substrate part 110a as its long direction and is mounted on the pair of connection pads 115.

Even in such a configuration, by making the area S2 smaller than the area S1 and/or giving a suitable thickness to the substrate part 110a, the difference of the hysteresis characteristics between that before mounting and that after mounting is reduced and consequently an effect of reducing the hysteresis characteristic is exhibited. Further, in the case where the long directions match between the second concave portion K2 and the substrate part 110a, the width of the second frame 110c is easily secured over the entire circumference of the second frame 110c. Therefore, it is easy to equally improve the strength for the insulation base body 110 as a whole.

Third Embodiment

Figure 6:
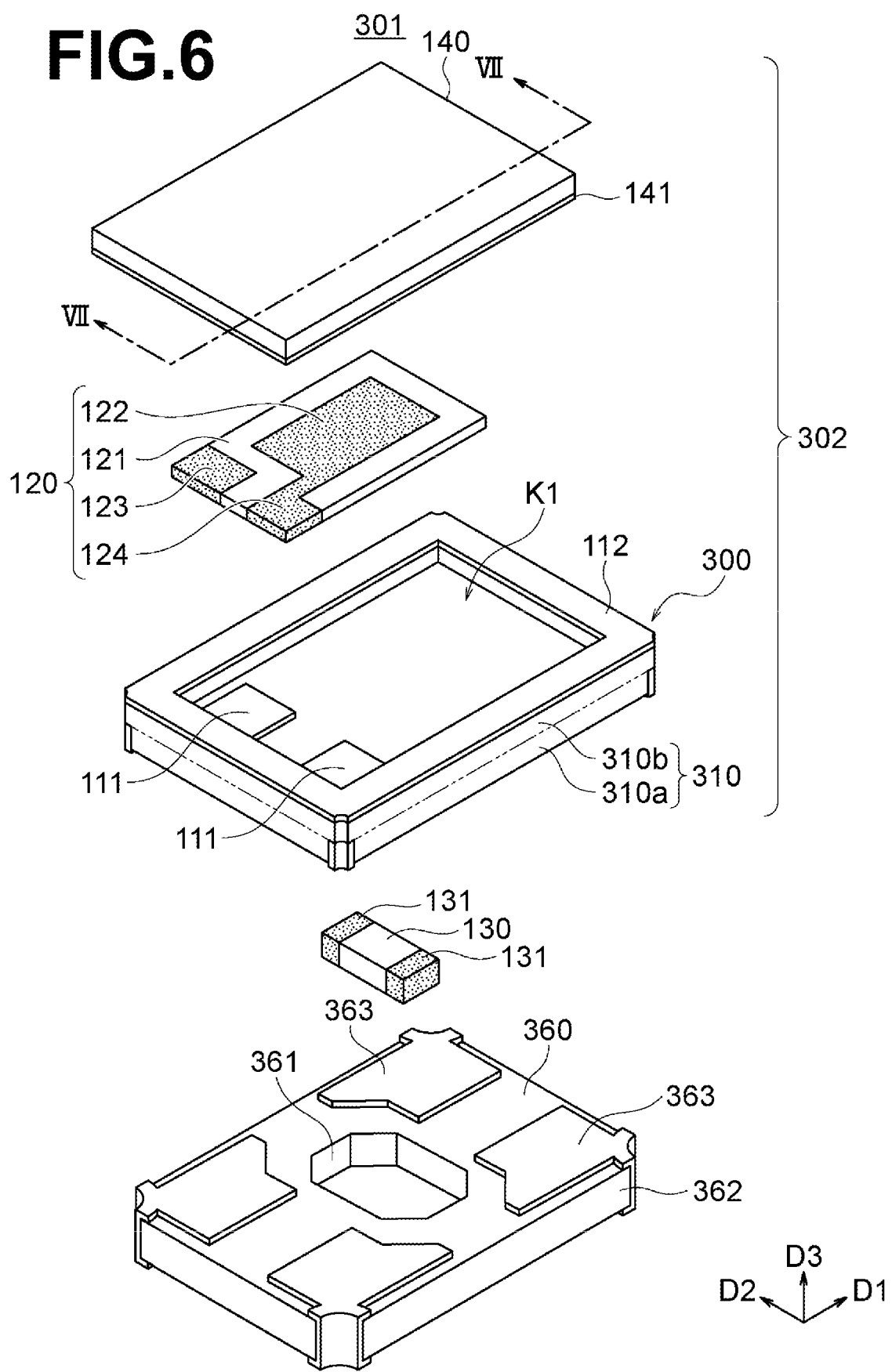
FIG. 6 is a disassembled perspective view showing the configuration of a crystal unit according to a third embodiment.
Figure 7:
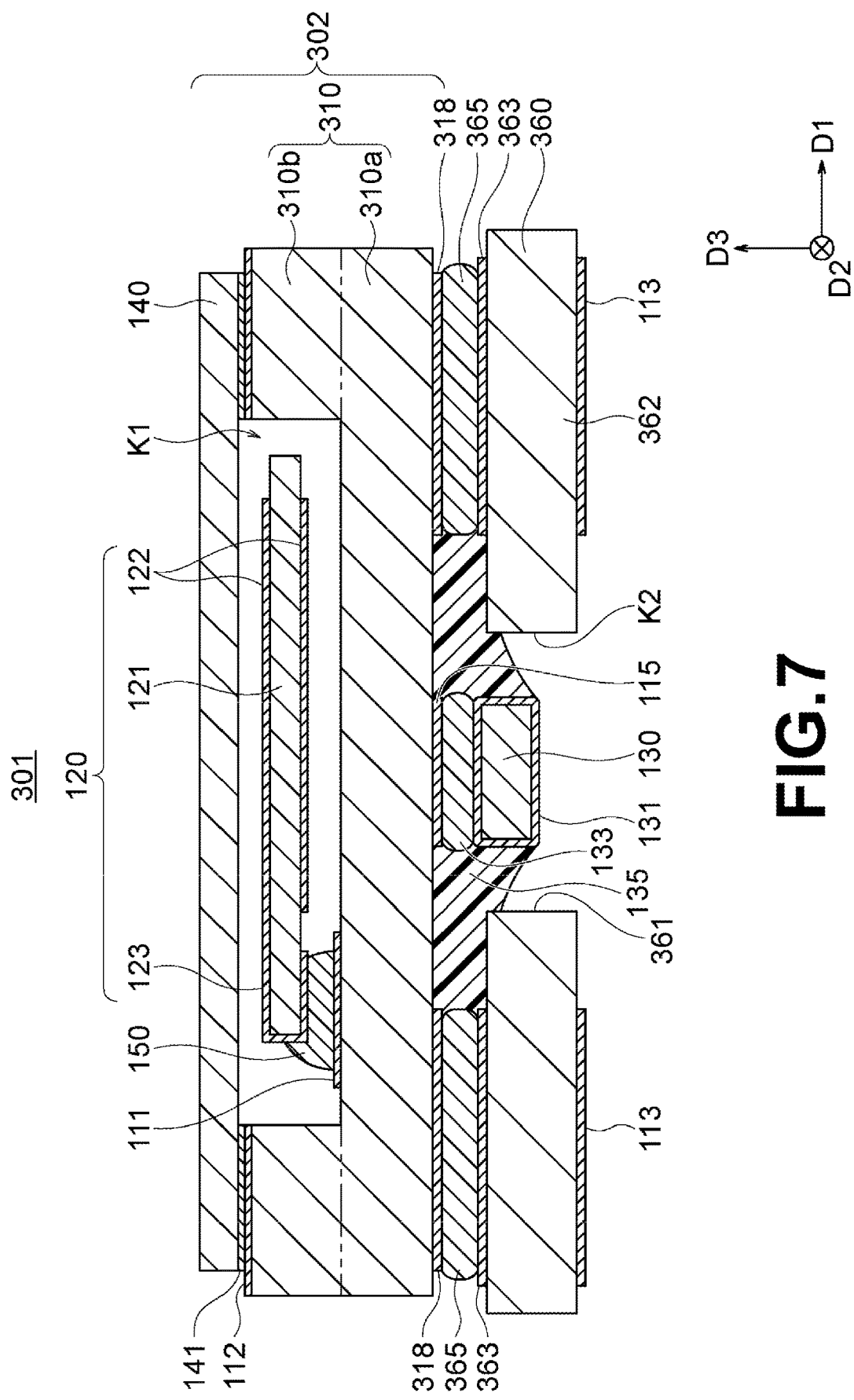
FIG. 7 is a cross-sectional view taken along the VII-VII line in FIG. 6.

FIG. 6 is a disassembled perspective view of a crystal unit 301 according to a third embodiment. FIG. 7 is a cross-sectional view taken along the VII-VII line in FIG. 6.

The crystal unit 301, for example, in the same way as the crystal unit 1 in the first embodiment, realizes a package of an H-shape in cross-section. In the present embodiment, however, the member corresponding to the second frame 110c in the first embodiment is not a member integrally formed with a substrate part 310a, but is configured by a circuit board 360 on which the substrate part 310a is mounted. Specifically, this is as follows.

The crystal unit 301 has a crystal unit 302 which is not equipped with a temperature sensing component, and the circuit board 360 on which this crystal unit 302 is mounted. The crystal unit 302 has an element mounting member 300 being container shape having the first concave portion K1 formed therein. The circuit board 360 has an opening 361. The crystal unit 302 is mounted on the circuit board 360 so as to close the opening 361 by its lower surface. Due to this, the second concave portion K2 is configured by the lower surface of the crystal unit 302 and the inner circumferential surface of the opening 361. From another viewpoint, an H-shaped package is realized by the package of the crystal unit 302, and the circuit board 360. In the lower surface of the crystal unit 302, in a region exposed at the opening 361, the temperature sensing element 130 is mounted. Due to this, the crystal unit 301 is formed into a crystal unit equipped with a temperature sensing component.

An insulation base body 310 in the element mounting member 300 is configured without the second frame 110c of the insulation base body 110 of the first embodiment. That is, the insulation base body 310 has a substrate part 310a and a first frame 310b. The lower surface of the substrate part 310a is provided with a plurality of (for example four) mounting terminals 318 (FIG. 7) for mounting the element mounting member 300 on the circuit board 360.

The four mounting terminals 318 are for example positioned at the four corners of the lower surface of the substrate part 310a. Two among the four mounting terminals 318 are electrically connected through not shown interconnect conductors provided in the insulation base body 310 with the pair of electrode pads 111. The other two among the four mounting terminals 318 are electrically connected through not shown interconnect conductors provided on and/or in the insulation base body 310 with the pair of connection pads 115.

The circuit board 360, for example, may be configured the same as a rigid type printed circuit board. The circuit board 360 has an insulation substrate 362 and various conductors (for example metal) provided on the insulation substrate 362. The "various conductors" are for example a plurality of (four in the present embodiment) mounting pads 363 for mounting the crystal unit 302 on the circuit board 360, a plurality of (four in the present embodiment) external terminals 113 for mounting the circuit board 360 (crystal unit 301) on the circuit board 180 (see FIG. 2), and not shown interconnect conductors for connecting the plurality of mounting pads 363 and the plurality of external terminals 113. Note that, although not particularly shown, the circuit board 360 may have a solder resist covering the insulation substrate 362 while leaving the external terminals 113 and the mounting pads 363 exposed.

The plurality of mounting terminals 318 in the crystal unit 302 and the plurality of mounting pads 363 in the circuit board 360 are arranged so as to face each other and are bonded by a bonding material 365 interposed between the two. Due to this, two among the four external terminals 113 are electrically connected with the pair of electrode pads 111. Further, the other two among the four external terminals 113 are electrically connected with the pair of connection pads 115. The bonding material 365 is comprised of solder or the like.

Between the lower surface of the substrate part 310a and the upper surface of the circuit board 360, a clearance having a size which is the same as the total thickness of the mounting terminals 318, bonding material 365, and mounting pads 363 is formed. In this clearance, a gas may be permitted to flow from the second concave portion K2 to the outside of the side surface of the crystal unit 301 or to the opposite direction to the former or may be prohibited from flowing by filling a resin 135. Note that, the height of filling the resin 135 with respect to the second concave portion K2 and/or temperature sensing element 130 may be suitably set as explained in the first embodiment.

The outer edge of the insulation substrate 362 in the circuit board 360 may be positioned on the inner side of the outer edge of the substrate part 310a, may substantially match with it, or may be positioned on the outer side from it (example shown). When the outer edge of the insulation substrate 362 substantially matches with the outer edge of the substrate part 310a, for example, the shapes and sizes of the mounting terminals 318, mounting pads 363, and external terminals 113 are substantially the same. Further, for example, when the outer edge of the insulation substrate 362 is positioned on the outer side from the outer edge of the substrate part 310a, for example, in the same way as the above explanation, the shapes and sizes of the mounting terminals 318, mounting pads 363, and external terminals 113 may be made substantially equal. Otherwise, the external terminals 113 may be made broader in area and/or may be positioned on the outer sides with respect to the mounting pads 363 and the mounting terminals 318. Otherwise, the external terminals 113 and mounting pads 363 may be made broader in area and/or may be positioned on the outer sides with respect to the mounting terminals 318.

The bottom view of the crystal unit 301 is the same as FIG. 3 of the first embodiment. Accordingly, FIG. 3 may be applied as the bottom view of the crystal unit 301 by replacing the notations of the second frame 110c etc. by the notations of the circuit board 360 etc. Further, the explanation of the relative positions and sizes of the external terminals 113 relative to the outer edge of the second frame 110c (substrate part 110a) or the region formed by the outer edge may be applied to the present embodiment.

In the first embodiment, the outer edge of the substrate part 110a and the outer edge of the second frame 110c were made to substantially match with each other. Accordingly, for example, the relative positions and sizes of the external terminals 113 or second concave portion K2 relative the outer edge of the substrate part 110a or the region formed by the outer edge and the relative positions and sizes of the external terminals 113 or second concave portion K2 relative to the outer edge of the second frame 110c or the region formed by the outer edge were not differentiated in the explanation.

In the present embodiment, the explanation of the relative positions and sizes of the external terminals 113 or second concave portion K2 in the first embodiment for example may be applied to the relative positions and sizes of the external terminals 113 or second concave portion K2 relative to the outer edge of the insulation substrate 362 in the circuit board 360 or the region formed by the outer edge. For example, the distance s1 and the area ratio S2/S1 may be specified with reference to the outer edge of the insulation substrate 362.

In addition, the explanation of the relative positions and sizes of the external terminals 113 or second concave portion K2 in the first embodiment may be applied to the relative positions and sizes of the external terminals 113 or second concave portion K2 relative to the outer edge of the substrate part 310a or the region formed by the outer edge. For example, the condition that the area ratio S2/S1 be 0.75 to 0.91 may stand when the area of the rectangular region configured by the outer edge of the insulation substrate 362 is S1 and may stand also at the time when the area of the rectangular region formed by the outer edge of the substrate part 310a is S1. Further, for example, the condition that the distance s1 be 30 µm to 90 µm may stand with respect to the outer edge of the insulation substrate 362 and may stand also with respect to the outer edge of the substrate part 310a.

Note that, in the first embodiment, when the outer edge of the substrate part 110a and the outer edge of the second frame 110b do not match, for example, in the same way as the present embodiment, the conditions of the distance s1 and area ratio etc. may be applied with reference to the outer edge of the second frame 110c. In addition, it may be applied to the substrate part 110a as well.

The mounting terminals 318 in the crystal unit 302 may contact or be separated from the outer edge of the substrate part 310a. When they are separated, the explanation of the relative positions and sizes of the external terminals 113 relative to the outer edge of the substrate part 110a (second frame 110c) or the region formed by the outer edge in the first embodiment may be applied or not applied to the explanation of the relative positions and sizes of the mounting terminals 318 relative to the outer edge of the substrate part 310a or the region formed by the outer edge. The planar shapes of the mounting terminals 318 may be suitable shapes. For example, in the same way as the external terminals 113 shown in FIG. 3, each of them may be shaped as a rectangle having four sides parallel to the four sides of the substrate part 310a from which a part on the second concave portion K2 side is removed.

The mounting pads 363 in the circuit board 360 may contact or be separated from the outer edge of the insulation substrate 362 in the circuit board 360. When they are separated, the explanation of the relative positions and sizes of the external terminals 113 relative to the outer edge of the second frame 110c or the region formed by the outer edge in the first embodiment may be applied or not applied to the explanation of the relative positions and sizes of the mounting pads 363 relative to the outer edge of the insulation substrate 362 or the region formed by the outer edge. The planar shapes of the mounting pads 363 may be suitable shapes. For example, in the same way as the external terminals 113 shown in FIG. 3, each of them may be shaped as a rectangle having four sides parallel to the four sides of the insulation substrate 362 from which a part on the second concave portion K2 side is removed.

As described above, in the present embodiment, the crystal unit 301 has the substrate (substrate part 310a), frame (insulation substrate 362 in the circuit board 360), electrode pads 111, connection pads 115, the plurality of external terminals 113, piezoelectric element (crystal element 120), temperature sensing component (temperature sensing element 130), and lid 140. The substrate part 310a is rectangle-shaped. The insulation substrate 362 includes a pair of portions (short side portions) which are positioned in regions on the sides of the pair of short sides of the substrate part 310a in the lower surface of the substrate part 310a and the concave portion (second concave portion K2) is formed between these pair of portions. The electrode pads 111 are positioned on the upper surface of the substrate part 310a. The connection pads 115 are positioned on the lower surface of the substrate part 310a in the insulation substrate 362 in a frame shape. The plurality of external terminals 113 are positioned on the lower surface of the insulation substrate 362. The crystal element 120 is mounted on the electrode pads 111. The temperature sensing element 130 is mounted on the connection pads 115. The lid 140 air-tightly seals the crystal element 120. The ratio S2/S2 between the area S1 of the rectangular region formed by the outer edge of the lower surface of the circuit board 360 and the area S2 of the smallest rectangular region R1 containing all external terminals 113 is 0.75 to 0.91 and/or the thickness in the vertical direction of the substrate part 310a is 80 µm to 150 µm.

Accordingly, the same effects as those by the first embodiment are exhibited. Specifically, for example, the area S2 is smaller than the area S1, therefore the force applied from the circuit board 180 through the plurality of external terminals 113 to the insulation substrate 362 becomes harder to act as the bending stress acting to make the insulation substrate 362 warp. Due to this, the bending stress which is transferred from the circuit board 360 to the substrate part 310a through the bonding material 365 bonding the circuit board 360 and the substrate part 310a is reduced. Consequently, the bending stress which is transferred from the substrate part 310a through the conductive adhesive 150 to the crystal element 120 is reduced. Further, for example, the thickness of the substrate part 310a is 80 µm or more, therefore the bending stress transferred to the crystal element 120 is reduced. As a result of reduction of the bending stress transferred to the crystal element 120, the change (increase) of the hysteresis characteristics caused by mounting to the circuit board 180 is reduced and consequently the hysteresis characteristic itself is reduced. Further, for example, the thickness of the substrate part 310a is 150 µm or less. Therefore, for example, compared with the case where the substrate part 310a is thicker than this, the probability of separation of the temperatures between the crystal element 120 and the temperature sensing element 130 which are separated by the substrate part 310a is reduced. As a result, the accuracy of temperature compensation is improved.

Further, in the present embodiment, the crystal unit 301 further has the mounting terminals 318 positioned on the lower surface of the substrate part 310a, mounting pads 363 positioned on the upper surface of the insulation substrate 362 in the circuit board 360, and the conductive bonding material 365 bonding the mounting terminals 318 and the mounting pads 363.

In this case, for example, when compared with the first embodiment, the warping and/or bending stress of the insulation substrate 362 is not directly transferred to the substrate part 310a. As a result, for example, the insulation substrate 362 warps more than the substrate part 310a, therefore it becomes easy to absorb the stress from the circuit board 180 by the insulation substrate 362. Further, for example, the resin 135 filled in the clearance between the substrate part 310a and the insulation substrate 362 can function as a buffer material relieving the stress. Although according to the dimensions and thermal expansion coefficients etc. of the crystal unit 302, circuit board 360, and circuit board 180, according to the mode of stress distribution, the bending stress generated in the substrate part 310a is reduced more than that in the first embodiment.

EXAMPLES (Influence of Area Ratio S2/S1)

Crystal units according to examples different in dimensions from each other were prepared and measured for their characteristics. As a result, it could be confirmed that the hysteresis characteristics could be reduced by making the area ratio S2/S1 smaller. Specifically, this is as follows.

The configuration of the crystal unit according to this example was made that in the first embodiment. That is, the frame was configured by the second frame 110c which was integrally formed with the substrate part 110a. Further, the long direction of the second concave portion K2 and temperature sensing element 130 was made the short direction of the element mounting member 100.

The principal design conditions of the crystal units according to the examples are as follows:
  Crystal blank 121: AT-cut
  Thickness of crystal blank 121: 43 μm
  Lengths of long sides of substrate part 110*a*: 1.6 mm
  Lengths of short sides of substrate part 110*a*: 1.2 mm
  Thickness of substrate part 110*a*: 120 μm
  Thickness of second frame 110*c*: 230 μm
  Thickness from lower surface of second frame 110*c* to upper surface of first frame 110*b*: 525 μm
  Material of insulation base body 110: Alumina ceramic
  Area ratio S2/S1: 11 types were set within a range of 0.729 to 1.000 by changing S2/S1 by 0.02 to 0.03.

Figure 8:
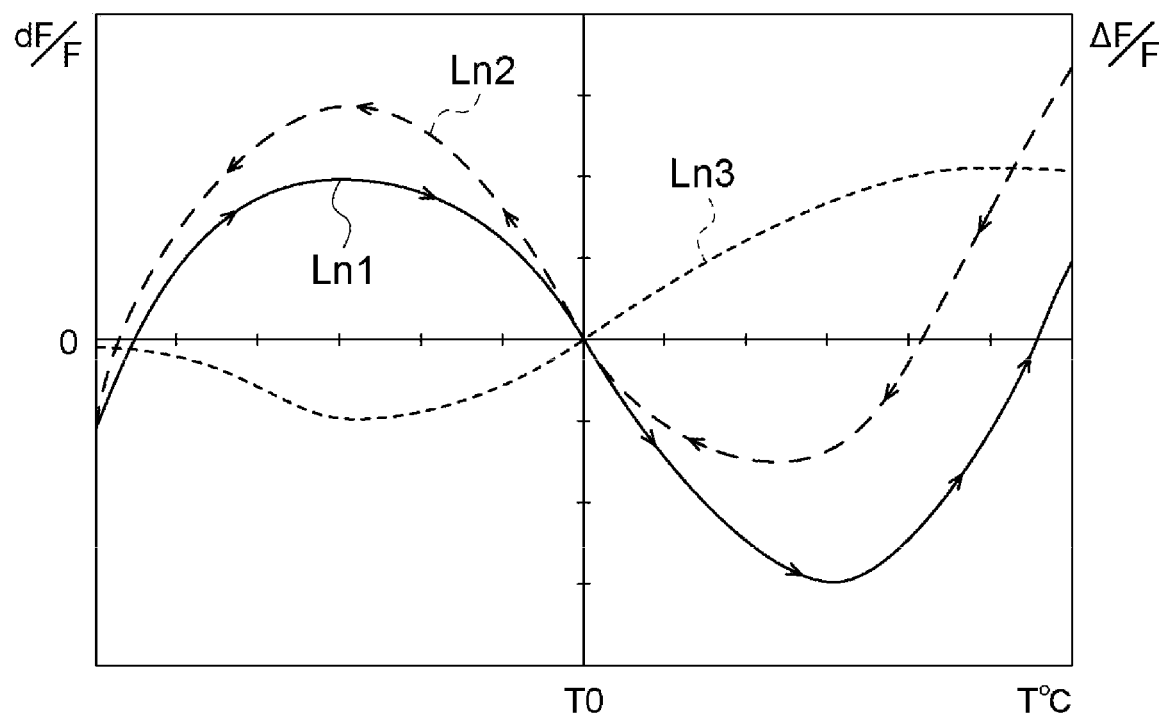
FIG. 8 is a conceptual view for explaining evaluation items for example.

FIG. 8 is a conceptual view for explaining the evaluation item of the normalized frequency difference ΔF/F for the crystal units according to the examples.

In this graph, an abscissa indicates the temperature T (° C.). An ordinate on the left side indicates a normalized frequency difference dF/F obtained by dividing a difference dF (Hz) between the designed frequency F (Hz) of the oscillation signal in the crystal unit and an actually measured frequency by the designed frequency F. A line Ln1 indicates one example of the correspondence relationships between the temperature T and the frequency difference dF/F at the time of a temperature rise. A Line Ln2 indicates one example of the correspondence relationships between the temperature T and the frequency difference dF/F at the time of a temperature fall.

As will be understood from this graph, the actual frequency changes due to a temperature change. The crystal unit is for example configured so that the frequency difference dF/F becomes close to 0 at a predetermined reference temperature T0. The reference temperature T0 is for example set within a range of so-called room temperature (for example 5° C. to 35° C.). Each of the lines Ln1 and Ln2 can be approximated by a cubic function. The already explained temperature compensation circuit has coefficients and constants in an equation or map data specifying the correspondence relationships between the temperature and the frequency difference dF (or a correction amount of capacitance etc. corresponding to the dF). Further, the circuit corrects the frequency of the oscillation signal based on the frequency difference dF corresponding to the detection temperature of the temperature sensing element 130.

As will be understood from the comparison of the lines Ln1 and Ln2, between the time of rise of the temperature and the time of fall of the temperature, the correspondence relationships between the temperature T and the frequency difference dF/F are different. This characteristic is the already explained hysteresis characteristic. The difference between dF/F at the time of rise of the temperature and dF/F at the time of fall of the temperature, which corresponds to the same temperature, is defined as the frequency difference ΔF/F. In FIG. 8, the ordinate on the right side indicates the frequency difference ΔF/F. A line Ln3 indicates the correspondence relationships between the temperature T and the frequency difference ΔF/F. The frequency difference ΔF/F changes with respect to the temperature T. Note that, in FIG. 8, ΔF/F is exaggerated more than the actual one.

The line Ln1 and the line Ln2 are for example obtained by measuring the frequency of the oscillation signal while raising the temperature from the lower limit side to the upper limit side in the range shown or making the temperature fall from the upper limit side to the lower limit side in the range shown. However, the crystal unit which is actually utilized is exposed to a more complex temperature change (temperature history). Accordingly, the temperature compensation amounts are not separately prescribed at the time of temperature rise and the time of temperature fall based on the lines Ln1 and Ln2. The temperature compensation amounts with respect to the same temperatures are the same between the time of temperature rise and the time of temperature fall. Accordingly, when the frequency difference ΔF/F is made smaller, for example, the accuracy of temperature compensation is improved.

Figure 9:
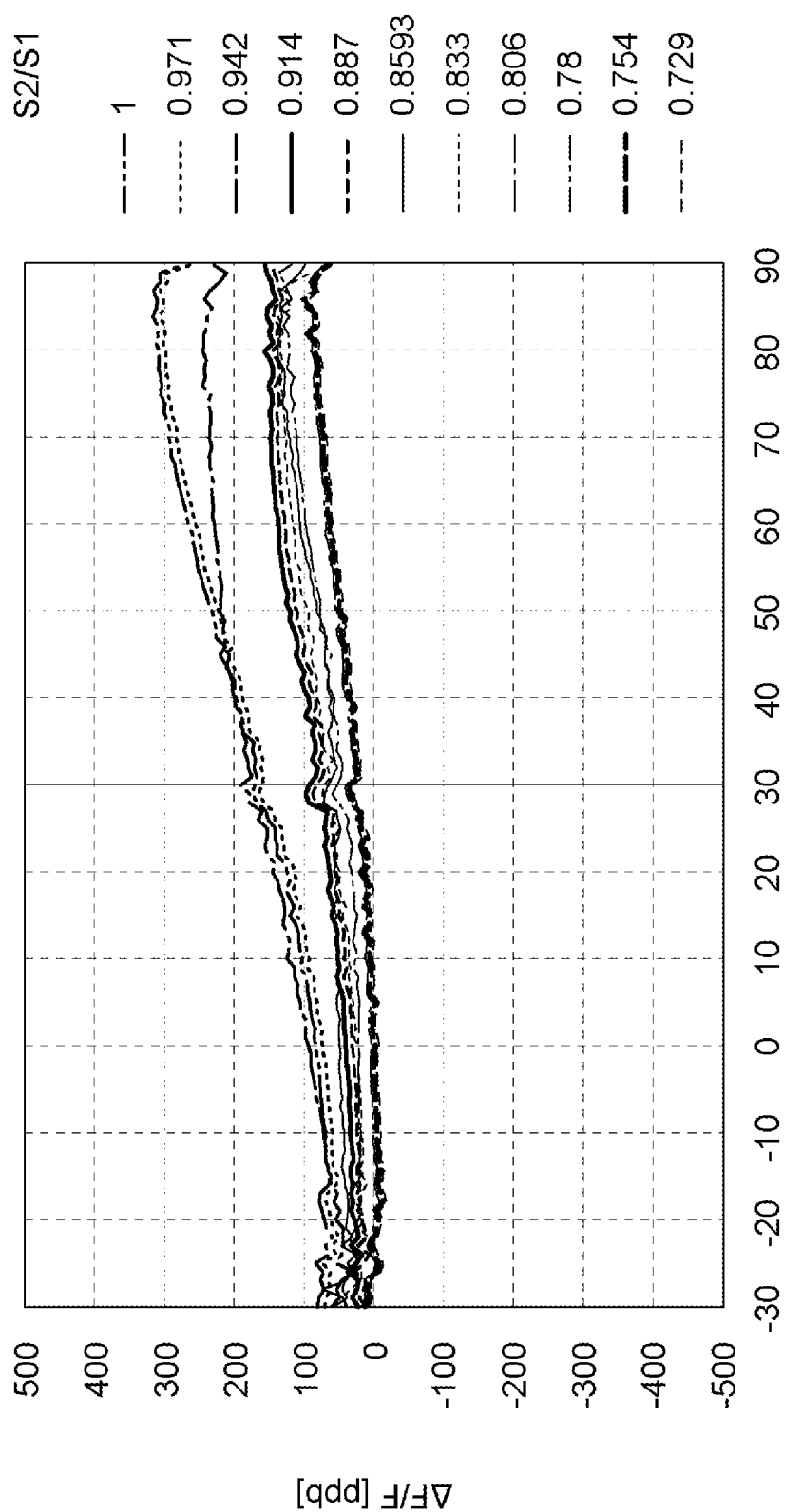
FIG. 9 is a view showing a hysteresis characteristic of a crystal unit according to an example.

FIG. 9 is a graph showing the hysteresis characteristics of the crystal units in a state where they are mounted on the circuit boards 180. In the graph, the abscissa indicates the temperatures T (° C.). The ordinate indicates the normalized frequency differences ΔF/F (ppb: parts per billion) which were explained with reference to FIG. 8. A plurality of lines in the graph indicate the correspondence relationships between the temperature T and the frequency difference ΔF/F in a plurality of examples in which the area ratios S2/S1 are different from each other. On the right side on the drawing sheet, the correspondence relationships between the types of line and the area ratio S2/S1 are shown. Note that, although not particularly shown, ΔF/F of the crystal units before mounting on the circuit boards 180 substantially fall into the range of 0±50 (ppb).

The area ratio S2/S1=1 indicates the characteristic of a crystal unit according to a comparative example. Further, by making the area ratio S2/S1 smaller than 1, the frequency difference ΔF/F becomes smaller. In particular, when the area ratio S2/S1 is 0.91 or less (the values at the third decimal places are rounded off), over the shown temperature range (−30° C. to 90° C.), a significant difference from the comparative example is recognized. Further, the smaller the area ratio S2/S1, the smaller the frequency difference ΔF/F. Further, it becomes close to 0. Accordingly, in the range shown, from only a viewpoint of making the frequency difference ΔF/F smaller, as understood, the area ratio S2/S1 is preferably as small as possible.

(Influence of Thickness of Substrate)

In the same way as the above description, crystal units according to examples having dimensions different from each other were prepared and were measured for their characteristics. As a result, it could be confirmed that the hysteresis characteristics could be reduced by making the substrates (substrate part 110*a* or substrate part 310*a*) thicker.

Here, for the configurations and design conditions of the crystal units according to the examples, basically only differences from the conditions of the examples (FIG. 9) for viewing the influence of the area ratio S2/S1 described above will be explained. The items which are not particularly explained are the same as those in the examples in FIG. 9. The thickness of the substrate part 110*a* was set for each 10 μm within a range from 50 μm to 170 μm. The area ratio S2/S1 was made a constant value (0.806).

Figure 10:
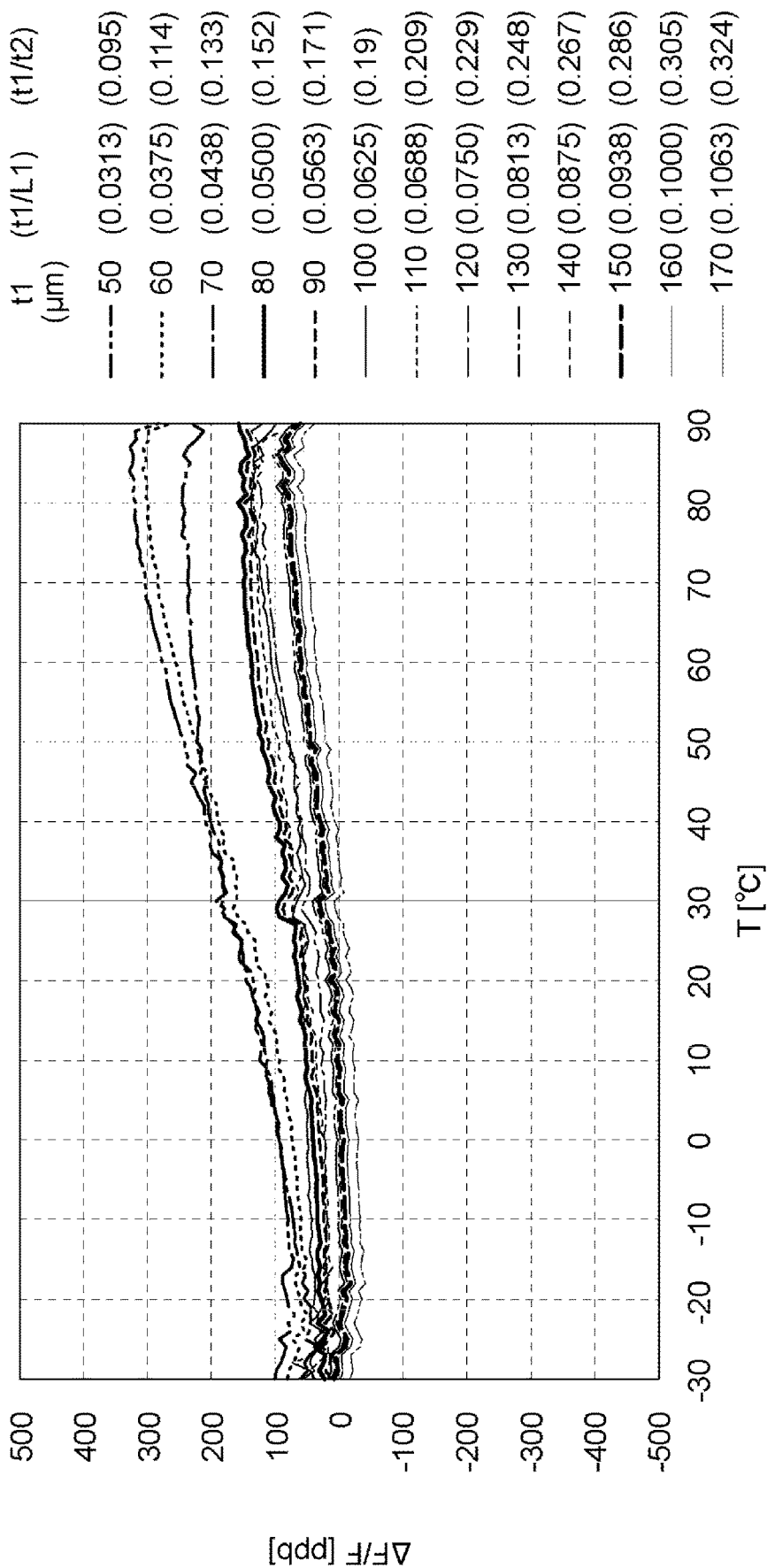
FIG. 10 is another view showing the hysteresis characteristic of the crystal unit according to an example.

FIG. 10 is a graph, the same as FIG. 9, which shows the hysteresis characteristics of crystal units in a state where they are mounted on the circuit boards 180. However, the plurality of lines in the graph indicate the correspondence relationships between the temperatures T and the frequency difference ΔF/F in a plurality of examples which are different in thickness of the substrate part 110*a* from each other. On the right side on the drawing sheet, the correspondence relationships between the types of lines and the thickness t1 (μm) of the substrate part 110*a* are shown. Further, on the right side thereof, values t1/L1 obtained by dividing the thickness t1 of the substrate part 110*a* by the length L1 of the long side of the substrate part 110*a* are attached. Further, on the right side thereof, values t1/t2 obtained by dividing the thickness t1 of the substrate part 110*a* by the thickness t2 of the mounting base body 110 (the thickness from the lower surface of the second frame 110*c* to the upper surface of the first frame 110*b*) are attached. Note that, although not particularly shown, the ΔF/F of the crystal units before mounting on the circuit boards 180 substantially fall into the range of 0±50 (ppb).

As shown in this graph, the larger the thickness t1 of the substrate part 110*a*, the smaller the frequency difference ΔF/F. In particular, when the thickness t1 of the substrate part 110*a* is 80 μm or more (s1/L1 is 0.050 or more), a significant difference from the case where the substrate 110*a* is thinner than this is recognized over the entirety of the shown temperature range (−30° C. to 90° C.).

Note that, in the above embodiments, each of the crystal units 1, 1-1, 201, and 301 is one example of the piezoelectric device. Each of the substrate part 110*a* and 310*a* is one example of a substrate. The second concave portion K2 is one example of a concave portion. Each of the second frame 110*c* and the circuit board 360 is one example of a frame. The crystal element 120 is one example of a piezoelectric element. The temperature sensing element 130 is one example of a temperature sensing component.

The technique according to the present disclosure is not limited to the above embodiments and modifications and may be worked in various ways.

The above embodiments and modifications may be suitably combined. For example, the configuration shown in FIG. 4 making the center of the figure of the concave portion (second concave portion K2) positioned on the opposite side to the electrode pads (111) relative to the center of the figure of the region formed by the outer edge of the substrate (substrate part 110*a*) or frame (second frame 110*c*) may be applied to the second or third embodiment as well. The configuration shown in FIG. 5 making the long direction of the concave portion and temperature sensing component (temperature sensing element 130) the long direction of the substrate or frame may be applied to the third embodiment as well.

The piezoelectric element is not limited to a vibration element utilized for a resonator. For example, the piezoelectric element may be an SAW (surface acoustic wave) element or another acoustic wave element or may be a vibration element of a piezoelectric vibrating structure gyroscope (gyro sensor). From another viewpoint, the piezoelectric device is not limited to a device generating an oscillation signal such as a resonator or oscillator. It may be one filtering the signal like an acoustic wave device or may be a sensor detecting a physical quantity like a gyro sensor.

The piezoelectric substance utilized for the piezoelectric element is not limited to a crystal. From another viewpoint, it is not limited to a single crystal. For example, the piezoelectric substance may be a ceramic (polycrystal), a single crystal of lithium tantalate, or a single crystal of lithium niobate.

The temperature sensing component is not limited to a temperature sensor in a narrow sense (temperature sensing element or transducer). For example, the temperature sensing component may have a function of processing an electrical signal obtained by converting temperature as well. As the processing, for example, there can be mentioned amplification, modulation, filtering, and computation based on the detection temperature. In other words, the temperature sensing component may be an integrated circuit element (IC) including a temperature sensing element as well.

The IC of the temperature sensing component described above, in a case where the piezoelectric element is a vibration element utilized for a resonator, may be one including an oscillation circuit which applies a voltage to the vibration element and generates an oscillation signal and a compensation circuit which performs temperature compensation of the frequency characteristics of the vibration element based on the temperature detected by the temperature sensing element as well. That is, the piezoelectric device may be a temperature compensation type oscillator as well.

When the IC of the temperature sensing component described above has an oscillation circuit and compensation circuit, for example, the vibration element and the IC are connected, and the IC and the external terminals on the frame are connected. In other words, the vibration element and the external terminals are not directly connected. Further, the electrical signal output from a terminal of the IC (terminal of the temperature sensing component) to an external terminal is for example an oscillation signal and not a signal including information of the temperature. As understood from this example, the temperature sensing component may utilize the electrical signal, which is generated in accordance with the temperature, inside the temperature sensing component without outputting the signal to the connection pad.

In the embodiment, the first frame 110*b* was provided on the substrate (substrate part 110*a*), and the flat plate-shaped lid was covered on that. However, the first frame 110*b* need not be provided, a box-shaped lid opened in the lower part may be bonded to the upper surface of the substrate, and the piezoelectric element may be sealed.

In the embodiment, the frame (second frame 110*c* and circuit board 360) was ring-shaped so as to extend along the entire circumference of the substrate. However, the frame need not be ring-shaped either. For example, the frame may be given a configuration having a pair of portions extending along the pair of short sides of the substrate and not having a portion extending along the pair of long sides of the substrate.

A number of external terminals larger than 4 may be provided. For example five or more external terminals may be arranged along the outer edge of the lower surface of the package as well. In the same way, numbers of external pads and connection pads or other terminals or pads other than the examples illustrated may also be provided.

The smallest rectangular region R1 containing the plurality of external terminals may match with the rectangular region formed by the outer edge of the lower surface of the frame as well. Further, when they do not coincide, not every external terminal needs to be separated from the outer edge of the lower surface of the frame. Further, the entirety of each of the external terminals needs not to be separated from the outer edge of the lower surface of the frame. For example, the external terminals at the four corners may be separated from only the long sides which they adjoin or may be separated from only the short sides which they adjoin.

Priorities are claimed on Japanese application No. 2018-221197 filed on Nov. 27, 2018, and No. 2018-221198, filed on Nov. 27, 2018, the contents of which are incorporated herein by reference.

REFERENCE SIGNS LIST

1 . . . crystal unit (piezoelectric device), 110*a* . . . substrate part (substrate), 110*c* . . . second frame (frame), 111 . . . electrode pad, 113 . . . external terminal, 115 . . . connection pad, 120 . . . crystal element (piezoelectric element), 130 . . . temperature sensing element (temperature sensing component), 140 . . . lid, and K2 . . . second concave portion (concave portion).

The invention claimed is:
1. A piezoelectric device comprising:
a rectangle-shaped substrate,
a frame which comprises a pair of portions located in regions on sides of a pair of short sides of the substrate on a lower surface of the substrate and configures a concave portion between the pair of portions,
an electrode pad on an upper surface of the substrate,
a connection pad on the lower surface of the substrate within the frame,
a plurality of external terminals on a lower surface of the frame,
a piezoelectric element mounted on the electrode pad,
a temperature sensing component mounted on the connection pad, and
a lid air-tightly sealing the piezoelectric element, wherein:
a ratio S2/S1 of an area S1 of a rectangular region formed by an outer edge of the lower surface of the frame and an area S2 of a smallest rectangular region containing all of the external terminals is 0.75 to 0.91,
a thickness in a vertical direction of the substrate is 100 μm to 150 μm,
a value obtained by dividing the thickness in the vertical direction of the substrate by lengths of long sides of the substrate is 0.063 to 0.094, and
a value obtained by dividing the thickness in the vertical direction of the substrate by a thickness in the vertical direction of the frame is 0.43 to 0.65.

2. The piezoelectric device according to claim 1, wherein the substrate and the frame are directly connected with each other.

3. The piezoelectric device according to claim 1, further comprising:
a mounting terminal on the lower surface of the substrate,
a mounting pad on an upper surface of the frame, and
a conductive bonding material bonding the mounting terminal and the mounting pad.

4. The piezoelectric device according to claim 1, wherein, when viewed on a plane, the electrode pad is located in its entirety outside of the concave portion.

5. The piezoelectric device according to claim 1, wherein each of the concave portion and the temperature sensing component comprises a shape in which its long direction is a direction that a pair of long sides of the substrate face each other.

6. The piezoelectric device according to claim 1, wherein when viewed on a plane, a center of a figure of the concave portion is located on an opposite side to the electrode pad more than a center of a figure of the substrate.

7. The piezoelectric device according to claim 1, further comprising an insulating resin adhered to the temperature sensing component and the lower surface of the substrate.

8. The piezoelectric device according to claim 1, further comprising:
a mounting terminal on the lower surface of the substrate,
a mounting pad on an upper surface of the frame,
a conductive bonding material bonding the mounting terminal and the mounting pad, and
an insulating resin adhered to the temperature sensing component and the lower surfaces of the substrate, wherein
the resin is located also in a clearance between the lower surface of the substrate and the upper surface of the frame.

9. An electronic apparatus comprising:
the piezoelectric device according to claim 1,
a base body, and
a plurality of external pads which are located on the surface of the base body and are bonded to a plurality of external terminals.

10. A piezoelectric device comprising:
a rectangle-shaped substrate,
a frame which comprises a pair of portions located in regions on sides of a pair of short sides of the substrate on a lower surface of the substrate and configures a concave portion between the pair of portions,
an electrode pad on an upper surface of the substrate,
a connection pad on the lower surface of the substrate within the frame,
a plurality of external terminals on a lower surface of the frame,
a piezoelectric element mounted on the electrode pad,
a temperature sensing component mounted on the connection pad, and
a lid air-tightly sealing the piezoelectric element, wherein:
a ratio S2/S1 of an area S1 of a rectangular region formed by an outer edge of the lower surface of the frame and an area S2 of a smallest rectangular region containing all of the external terminals is 0.75 to 0.91, and
when viewed on a plane, a center of a figure of the concave portion is located on an opposite side to the electrode pad more than a center of a figure of the substrate.

11. The piezoelectric device according to claim 10, wherein a thickness in a vertical direction of the substrate is 80 μm to 150 μm.

12. The piezoelectric device according to claim 11, wherein a value obtained by dividing the thickness in the vertical direction of the substrate by lengths of long sides of the substrate is 0.050 to 0.094.

13. The piezoelectric device according to claim 10, wherein the substrate and the frame are directly connected with each other.

14. The piezoelectric device according to claim 10, further comprising:
a mounting terminal on the lower surface of the substrate,
a mounting pad on an upper surface of the frame, and
a conductive bonding material bonding the mounting terminal and the mounting pad.

15. The piezoelectric device according to claim 10, wherein, when viewed on a plane, the electrode pad is located in its entirety outside of the concave portion.

16. The piezoelectric device according to claim 10, wherein each of the concave portion and the temperature sensing component comprises a shape in which its long direction is a direction that a pair of long sides of the substrate face each other.

17. The piezoelectric device according to claim 10, further comprising an insulating resin adhered to the temperature sensing component and the lower surface of the substrate.

18. The piezoelectric device according to claim 10, further comprising:
a mounting terminal on the lower surface of the substrate,
a mounting pad on an upper surface of the frame,
a conductive bonding material bonding the mounting terminal and the mounting pad, and
an insulating resin adhered to the temperature sensing component and the lower surfaces of the substrate, wherein the resin is located also in a clearance between the lower surface of the substrate and the upper surface of the frame.

19. An electronic apparatus comprising:
the piezoelectric device according to claim 10,
a base body, and
a plurality of external pads which are located on the surface of the base body and are bonded to a plurality of external terminals.

* * * * *